United States Patent
Yamagajo et al.

(10) Patent No.: US 6,456,949 B1
(45) Date of Patent: Sep. 24, 2002

(54) METHOD AND APPARATUS FOR CALCULATING ELECTROMAGNETIC FIELD INTENSITY, AND A COMPUTER-READABLE RECORDING MEDIUM

(75) Inventors: Takashi Yamagajo; Kenji Nagase; Shinichi Ohtsu; Makoto Mukai, all of Kanagawa (JP)

(73) Assignee: Fujitsu Limited, Kawasaki (JP)

( * ) Notice: Subject to any disclaimer, the term of this patent is extended or adjusted under 35 U.S.C. 154(b) by 51 days.

(21) Appl. No.: 09/614,129

(22) Filed: Jul. 11, 2000

(30) Foreign Application Priority Data

Oct. 20, 1999 (JP) .............................. 11-298875
May 17, 2000 (JP) ........................ 2000-144432

(51) Int. Cl.[7] .............................................. G06F 17/00
(52) U.S. Cl. .............................. 702/65; 702/123; 703/2; 703/4
(58) Field of Search ........................... 702/57, 65, 123; 703/2, 3, 4; 706/919, 920, 921, 922; 324/262–263, 600

(56) References Cited

U.S. PATENT DOCUMENTS

| 5,745,370 A | * | 4/1998 | Ohtsu et al. ................. 706/920 |
| 5,940,310 A | * | 8/1999 | Yamaguchi et al. ........... 703/4 |
| 6,083,266 A | * | 7/2000 | Ohtsu et al. .................... 703/2 |
| 6,285,957 B1 | * | 9/2001 | Tanaka et al. ................. 702/65 |

FOREIGN PATENT DOCUMENTS

| JP | HEI 7-302258 A | 11/1995 | ........... G06F/17/00 |
| JP | HEI 7-302277 A | 11/1995 | ........... G06F/17/50 |
| JP | HEI 7-302278 A | 11/1995 | ........... G06F/17/50 |
| JP | HEI 9-15281 A | 1/1997 | ........... G01R/29/08 |
| JP | HEI1 11-15184 A | 1/1999 | |

* cited by examiner

*Primary Examiner*—Bryan Bui
(74) *Attorney, Agent, or Firm*—Staas & Halsey LLP

(57) ABSTRACT

A mesh processor divides a target device into a plurality of patches. A mutual impedance calculator computes a mutual impedance between the patches based on previously computed analytic solutions of a quadruple integration under the condition that the patches are rectangular in shape and are parallel or perpendicular to each other. Finally, an electromagnetic field intensity calculator calculates electromagnetic field intensity based on the computed mutual impedance.

28 Claims, 19 Drawing Sheets

PRIOR ART

FIG. 6

ONE EXAMPLE OF ANALYTIC SOLUTION OF QUADRUPLE INTEGRAL $$\int\int\int\int r^{-1} dxdXdydY =$$

$+2\xi_{00}[\eta_{00}\text{htan}^{-1}(r_{0000}+\xi_{00}+\eta_{00})/h - \eta_{01}\text{htan}^{-1}(r_{0001}+\xi_{00}+\eta_{01})/h - \eta_{10}\text{htan}^{-1}(r_{0010}+\xi_{00}+\eta_{10})/h - \eta_{11}\text{htan}^{-1}(r_{0011}+\xi_{00}+\eta_{11})/h]$ $-2\xi_{01}[\eta_{00}\text{htan}^{-1}(r_{0100}+\xi_{01}+\eta_{00})/h - \eta_{01}\text{htan}^{-1}(r_{0101}+\xi_{01}+\eta_{01})/h - \eta_{10}\text{htan}^{-1}(r_{0110}+\xi_{01}+\eta_{10})/h - \eta_{11}\text{htan}^{-1}(r_{0111}+\xi_{01}+\eta_{11})/h]$ $-2\xi_{10}[\eta_{00}\text{htan}^{-1}(r_{1000}+\xi_{10}+\eta_{00})/h - \eta_{01}\text{htan}^{-1}(r_{1001}+\xi_{10}+\eta_{01})/h - \eta_{10}\text{htan}^{-1}(r_{1010}+\xi_{10}+\eta_{10})/h - \eta_{11}\text{htan}^{-1}(r_{1011}+\xi_{10}+\eta_{11})/h]$ $+2\xi_{11}[\eta_{00}\text{htan}^{-1}(r_{1100}+\xi_{11}+\eta_{00})/h - \eta_{01}\text{htan}^{-1}(r_{1101}+\xi_{11}+\eta_{01})/h - \eta_{10}\text{htan}^{-1}(r_{1110}+\xi_{11}+\eta_{10})/h - \eta_{11}\text{htan}^{-1}(r_{1111}+\xi_{11}+\eta_{11})/h]$ $+1/2\xi_{00}[\eta_{00}\ln(r_{0000}+\eta_{00}) - \eta_{01}\ln(r_{0001}+\eta_{01}) - \eta_{10}\ln(r_{0010}+\eta_{10}) + \eta_{11}\ln(r_{0011}+\eta_{11})]$ $-1/2\xi_{01}[\eta_{00}\ln(r_{0100}+\eta_{00}) - \eta_{01}\ln(r_{0101}+\eta_{01}) - \eta_{10}\ln(r_{0110}+\eta_{10}) + \eta_{11}\ln(r_{0111}+\eta_{11})]$ $-1/2\xi_{10}[\eta_{00}\ln(r_{1000}+\eta_{00}) - \eta_{01}\ln(r_{1001}+\eta_{01}) - \eta_{10}\ln(r_{1010}+\eta_{10}) + \eta_{11}\ln(r_{1011}+\eta_{11})]$ $+1/2\xi_{11}[\eta_{00}\ln(r_{1100}+\eta_{00}) - \eta_{01}\ln(r_{1101}+\eta_{01}) - \eta_{10}\ln(r_{1110}+\eta_{10}) + \eta_{11}\ln(r_{1111}+\eta_{11})]$ $+1/2\eta_{00}h^2[+\ln(\eta_{00}+r_{0000}) - \ln(\eta_{00}+r_{0100}) - \ln(\eta_{00}+r_{1000}) + \ln(\eta_{00}+r_{1100})]$ $-1/2\eta_{01}h^2[+\ln(\eta_{00}+r_{0001}) - \ln(\eta_{01}+r_{0101}) - \ln(\eta_{01}+r_{1001}) + \ln(\eta_{01}+r_{1101})]$ $-1/2\eta_{10}h^2[+\ln(\eta_{00}+r_{0010}) - \ln(\eta_{10}+r_{0110}) - \ln(\eta_{10}+r_{1010}) + \ln(\eta_{10}+r_{1110})]$ $-1/2\eta_{11}h^2[+\ln(\eta_{00}+r_{0011}) - \ln(\eta_{11}+r_{0111}) - \ln(\eta_{11}+r_{1011}) + \ln(\eta_{11}+r_{1111})]$ $+1/2\xi_{00}h^2[+\ln(r_{0000}+\xi_{00}) - \ln(r_{0010}+\xi_{00}) - \ln(r_{0011}+\xi_{00}) + \ln(r_{0011}+\xi_{00})]$ $-1/2\xi_{01}h^2[+\ln(r_{0100}+\xi_{01}) - \ln(r_{0101}+\xi_{01}) - \ln(r_{0110}+\xi_{01}) + \ln(r_{0111}+\xi_{01})]$ $-1/2\xi_{10}h^2[+\ln(r_{1000}+\xi_{10}) - \ln(r_{1001}+\xi_{10}) - \ln(r_{1010}+\xi_{10}) + \ln(r_{1011}+\xi_{10})]$ $-1/2\xi_{11}h^2[+\ln(r_{1100}+\xi_{11}) - \ln(r_{1101}+\xi_{11}) - \ln(r_{1110}+\xi_{11}) + \ln(r_{1111}+\xi_{11})]$ $-1/6\eta_{00}^2[+r_{0000}-r_{0100}-r_{1000}+r_{1100}]+1/6\eta_{01}^2[+r_{0001}-r_{0101}-r_{1001}+r_{1101}]+1/6\eta_{10}^2[+r_{0010}-r_{0110}-r_{1010}+r_{1110}]-1/6\eta_{11}^2[+r_{0011}-r_{0111}-r_{1011}+r_{1111}]$ $-1/6\xi_{00}^2[+r_{0000}-r_{0100}-r_{0100}-r_{1000}+r_{1100}]+1/6\xi_{01}^2[+r_{0001}-r_{0101}-r_{1001}+r_{1101}]+1/6\xi_{10}^2[+r_{0010}-r_{0110}-r_{1010}+r_{1110}]-1/6\xi_{11}^2[+r_{0011}-r_{0111}-r_{1011}+r_{1111}]$ $+1/3\xi_{00}h^2[+r_{0000}+r_{0000}-r_{0100}-r_{1000}+r_{1100}]-1/3\xi_{01}h^2[+r_{0001}-r_{0101}-r_{1001}+r_{1101}]-1/3\xi_{10}h^2[+r_{0010}-r_{0110}-r_{1010}+r_{1110}]+1/3\xi_{11}h^2[+r_{0011}-r_{0111}-r_{1011}+r_{1111}]$

MODEL OF
SHIELD BOX

FIG.8A

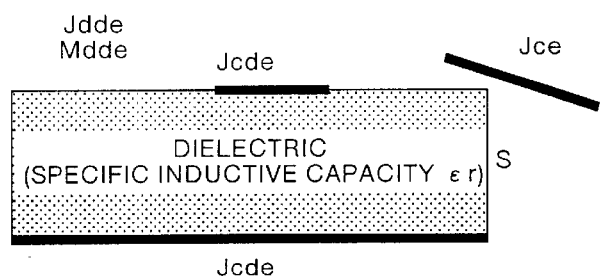

FIG.8B $$\begin{bmatrix} Z^e_{ce,ce} & Z^e_{ce,cde} & Z^e_{ce,dde} & Y^e_{ce,dde} \\ Z^e_{cde,ce} & Z^e_{cde,cde}+Z^d_{cde,cde} & Z^e_{cde,dde}+Z^d_{cde,dde} & Y^e_{cde,dde}+Y^d_{cde,dde} \\ Z^e_{dde,ce} & Z^e_{dde,cde}+Z^d_{dde,cde} & Z^e_{dde,dde}+Z^d_{dde,dde} & Y^e_{dde,dde}+Y^d_{dde,dde} \\ Y^e_{dde,ce} & Y^e_{dde,cde}+Y^d_{dde,cde} & Y^e_{dde,dde}+Y^d_{dde,dde} & -Z^e_{dde,dde}-Z^d_{dde,dde} \end{bmatrix} \begin{bmatrix} I_{ce} \\ I_{cde} \\ I_{dde} \\ I_{dde} \end{bmatrix} = \begin{bmatrix} V_e \\ V_{de} \\ 0 \\ 0 \end{bmatrix}$$

FIG. 14

$$\int\int\int\int \frac{1}{r^3} dx\, dX\, dy\, dY =$$

A:
$-\xi_{00}/h \quad [+\eta_{00}\tan^{-1}(r_{0000}-\xi_{00}-\eta_{00})/h - \eta_{01}\tan^{-1}(r_{0001}-\xi_{00}-\eta_{01})/h - \eta_{10}\tan^{-1}(r_{0010}-\xi_{00}-\eta_{10})/h + \eta_{11}\tan^{-1}(r_{0011}-\xi_{00}-\eta_{11})/h]$
$+\xi_{01}/h \quad [+\eta_{00}\tan^{-1}(r_{0100}-\xi_{01}-\eta_{00})/h - \eta_{01}\tan^{-1}(r_{0101}-\xi_{01}-\eta_{01})/h - \eta_{10}\tan^{-1}(r_{0110}-\xi_{01}-\eta_{10})/h + \eta_{11}\tan^{-1}(r_{0111}-\xi_{01}-\eta_{11})/h]$
$+\xi_{10}/h \quad [+\eta_{00}\tan^{-1}(r_{1000}-\xi_{10}-\eta_{00})/h - \eta_{01}\tan^{-1}(r_{1001}-\xi_{10}-\eta_{01})/h - \eta_{10}\tan^{-1}(r_{1010}-\xi_{10}-\eta_{10})/h + \eta_{11}\tan^{-1}(r_{1011}-\xi_{10}-\eta_{11})/h]$
$-\xi_{11}/h \quad [+\eta_{00}\tan^{-1}(r_{1100}-\xi_{11}-\eta_{00})/h - \eta_{01}\tan^{-1}(r_{1101}-\xi_{11}-\eta_{01})/h - \eta_{10}\tan^{-1}(r_{1110}-\xi_{11}-\eta_{10})/h + \eta_{11}\tan^{-1}(r_{1111}-\xi_{11}-\eta_{11})/h]$ B:
$-\xi_{00}/h \quad [+\eta_{00}\tan^{-1}(r_{0000}+\xi_{00}+\eta_{00})/h - \eta_{01}\tan^{-1}(r_{0001}+\xi_{00}-\eta_{01})/h + \eta_{10}\tan^{-1}(r_{0010}+\xi_{00}+\eta_{10})/h + \eta_{11}\tan^{-1}(r_{0011}+\xi_{00}+\eta_{11})/h]$
$+\xi_{01}/h \quad [+\eta_{00}\tan^{-1}(r_{0100}+\xi_{01}+\eta_{00})/h - \eta_{01}\tan^{-1}(r_{0101}+\xi_{01}-\eta_{01})/h + \eta_{10}\tan^{-1}(r_{0110}+\xi_{01}+\eta_{10})/h + \eta_{11}\tan^{-1}(r_{0111}+\xi_{01}+\eta_{11})/h]$
$+\xi_{10}/h \quad [+\eta_{00}\tan^{-1}(r_{1000}+\xi_{10}+\eta_{00})/h - \eta_{01}\tan^{-1}(r_{1001}+\xi_{10}-\eta_{01})/h + \eta_{10}\tan^{-1}(r_{1010}+\xi_{10}+\eta_{10})/h + \eta_{11}\tan^{-1}(r_{1011}+\xi_{10}+\eta_{11})/h]$
$-\xi_{11}/h \quad [+\eta_{00}\tan^{-1}(r_{1100}+\xi_{11}+\eta_{00})/h - \eta_{01}\tan^{-1}(r_{1101}+\xi_{11}-\eta_{01})/h + \eta_{10}\tan^{-1}(r_{1110}+\xi_{11}+\eta_{10})/h + \eta_{11}\tan^{-1}(r_{1111}+\xi_{11}+\eta_{11})/h]$ $-\eta_{00}/2[+\ln(r_{0000}-\eta_{00})-\ln(r_{0100}-\eta_{00})-\ln(r_{1000}-\eta_{00})+\ln(r_{1100}-\eta_{00})]$
$+\eta_{01}/2[+\ln(r_{0001}-\eta_{01})-\ln(r_{0101}-\eta_{01})-\ln(r_{1001}-\eta_{01})+\ln(r_{1101}-\eta_{01})]$
$+\eta_{10}/2[+\ln(r_{0010}-\eta_{10})-\ln(r_{0110}-\eta_{10})-\ln(r_{1010}-\eta_{10})+\ln(r_{1110}-\eta_{10})]$
$-\eta_{11}/2[+\ln(r_{0011}-\eta_{11})-\ln(r_{0111}-\eta_{11})-\ln(r_{1011}-\eta_{11})+\ln(r_{1111}-\eta_{11})]$ $+\eta_{00}/2[+\ln(r_{0000}+\eta_{00})-\ln(r_{0100}+\eta_{00})-\ln(r_{1000}+\eta_{00})+\ln(r_{1100}+\eta_{00})]$
$-\eta_{01}/2[+\ln(r_{0001}+\eta_{01})-\ln(r_{0101}+\eta_{01})-\ln(r_{1001}+\eta_{01})+\ln(r_{1101}+\eta_{01})]$
$-\eta_{10}/2[+\ln(r_{0010}+\eta_{10})-\ln(r_{0110}+\eta_{10})-\ln(r_{1010}+\eta_{10})+\ln(r_{1110}+\eta_{10})]$
$+\eta_{11}/2[+\ln(r_{0011}+\eta_{11})-\ln(r_{0111}+\eta_{11})-\ln(r_{1011}+\eta_{11})+\ln(r_{1111}+\eta_{11})]$ C:
$+\xi_{00} \quad [+\ln(r_{0000}+\xi_{00})-\ln(r_{0001}+\xi_{00})-\ln(r_{0010}+\xi_{00})+\ln(r_{0011}+\xi_{00})]$
$-\xi_{01} \quad [+\ln(r_{0100}+\xi_{01})-\ln(r_{0101}+\xi_{01})-\ln(r_{0110}+\xi_{01})+\ln(r_{0111}+\xi_{01})]$
$-\xi_{10} \quad [+\ln(r_{1000}+\xi_{10})-\ln(r_{1001}+\xi_{10})-\ln(r_{1010}+\xi_{10})+\ln(r_{1011}+\xi_{10})]$
$+\xi_{11} \quad [+\ln(r_{1100}+\xi_{11})-\ln(r_{1101}+\xi_{11})-\ln(r_{1110}+\xi_{11})+\ln(r_{1111}+\xi_{11})]$ D:
$-r_{0000}+r_{0001}+r_{0010}-r_{0011}$
$+r_{0100}-r_{0101}-r_{0110}+r_{0111}$
$+r_{1000}-r_{1001}-r_{1010}+r_{1011}$
$-r_{1100}+r_{1101}+r_{1110}-r_{1111}$

FIG.15

$$
\begin{aligned}
=&+2\xi_{00}\zeta_{00}\int_z [F(\xi_{00}, y_0, Z)-F(\xi_{00}, y_1, Z)]dZ -2\xi_{01}\zeta_{01}\int_z [F(\xi_{01}, y_0, Z)-F(\xi_{01}, y_1, Z)]dZ \\
&-2\xi_{10}\zeta_{10}\int_z [F(\xi_{10}, y_1, Z)-F(\xi_{10}, y_1, Z)]dZ +2\xi_{11}\zeta_{11}\int_z [F(\xi_{11}, y_0, Z)-F(\xi_{11}, y_1, Z)]dZ \\
=&+2\xi_{00}\zeta_{00}\int_z 1/z \tan^{-1}(z/(r_{000z}+\xi_{00}+y_0))dZ - \int_z 1/z \tan^{-1}(z/(r_{000z}-\xi_{00}+y_0))dZ \\
&-2\xi_{00}\zeta_{00}\int_z 1/z \tan^{-1}(z/(r_{001z}+\xi_{00}+y_1))dZ - \int_z 1/z \tan^{-1}(z/(r_{001z}-\xi_{00}+y_1))dZ \\
&-2\xi_{01}\zeta_{01}\int_z 1/z \tan^{-1}(z/(r_{010z}+\xi_{01}+y_0))dZ - \int_z 1/z \tan^{-1}(z/(r_{010z}-\xi_{01}+y_0))dZ \\
&+2\xi_{01}\zeta_{01}\int_z 1/z \tan^{-1}(z/(r_{011z}+\xi_{00}+y_1))dZ - \int_z 1/z \tan^{-1}(z/(r_{011z}-\xi_{00}+y_1))dZ \\
&-2\xi_{10}\zeta_{10}\int_z 1/z \tan^{-1}(z/(r_{100z}+\xi_{10}+y_0))dZ - \int_z 1/z \tan^{-1}(z/(r_{100z}-\xi_{10}+y_0))dZ \\
&+2\xi_{10}\zeta_{10}\int_z 1/z \tan^{-1}(z/(r_{101z}+\xi_{10}+y_1))dZ - \int_z 1/z \tan^{-1}(z/(r_{101z}-\xi_{10}+y_1))dZ \\
&+2\xi_{11}\zeta_{11}\int_z 1/z \tan^{-1}(z/(r_{110z}+\xi_{11}+y_0))dZ - \int_z 1/z \tan^{-1}(z/(r_{110z}-\xi_{11}+y_0))dZ \\
&-2\xi_{11}\zeta_{11}\int_z 1/z \tan^{-1}(z/(r_{111z}+\xi_{11}+y_1))dZ - \int_z 1/z \tan^{-1}(z/(r_{111z}-\xi_{11}+y_1))dZ
\end{aligned}
$$

WIRE: DIAMETER 0.01 mm

FIG.20

| WHEN ANALYTIC SOLUTION OF QUADRUPLE INTEGRAL IS USED | WHEN GAUSS INTEGRATION (CONVENTIONAL METHOD) IS USED |
|---|---|
| \*\*\* V5 L1.0 \*\*\*<br>HOSTNAME : 12.7MB<br>　\*syntax check : completed<br>Calculated FRM<br>　　\*immittance<br>　　　　0.1MHz : 259sec<br>　　\*current<br>　　　　0.1MHz : 5sec<br>　　\*immittance<br>　　　　0.2MHz : 225sec<br>　　\*current<br>　　　　0.2MHz : 5sec<br>　　\*immittance<br>　　　　0.3MHz : 213sec<br>　　\*current<br>　　　　0.3MHz : 4sec<br>　　\*immittance<br>　　　　0.4MHz : 211sec<br>　　\*current<br>　　　　0.4MHz : 5sec<br>　　\*immittance<br>　　　　0.5MHz : 211sec<br>　　\*current<br>　　　　0.5MHz : 5sec<br>　\*immittance<br>　　　　0.6MHz : 210sec<br>　\*current<br>　　　　0.6MHz : 5sec<br>　\*immittance<br>　　　　0.7MHz : 204sec<br>　\*current<br>　　　　0.7MHz : 5sec<br>\*\*\*/af2/data/pcb0003s.af completed.\*\*\* | \*\*\* V5 L1.0 \*\*\*<br>HOSTNAME : 12.7MB<br>　\*syntax check : completed<br>Calculated FRM<br>　　\*immittance<br>　　　　0.1MHz : 446sec<br>　　\*current<br>　　　　0.1MHz : 5sec<br>　　\*immittance<br>　　　　0.2MHz : 414sec<br>　　\*current<br>　　　　0.2MHz : 5sec<br>　　\*immittance<br>　　　　0.3MHz : 405sec<br>　　\*current<br>　　　　0.3MHz : 4sec<br>　　\*immittance<br>　　　　0.4MHz : 406sec<br>　　\*current<br>　　　　0.4MHz : 5sec<br>　　\*immittance<br>　　　　0.5MHz : 408sec<br>　　\*current<br>　　　　0.5MHz : 5sec<br>　\*immittance<br>　　　　0.6MHz : 406sec<br>　\*current<br>　　　　0.6MHz : 5sec<br>　\*immittance<br>　　　　0.7MHz : 400sec<br>　\*current<br>　　　　0.7MHz : 5sec<br>\*\*\*/af2/data/pcb0003sg.af completed.\*\*\* |

$$\int\int\int\int \frac{1}{r^3} dx\, dX\, dy\, dY =$$

$$+\frac{1}{2h}\begin{Bmatrix} [-\xi_{00}\zeta_{00} & [+\eta_{00}\tan^{-1}\frac{r_{0000}-\xi_{00}-\eta_{00}}{h} & -\eta_{01}\tan^{-1}\frac{r_{0001}-\xi_{00}-\eta_{01}}{h} & -\eta_{10}\tan^{-1}\frac{r_{0010}-\xi_{00}-\eta_{10}}{h} & -\eta_{11}\tan^{-1}\frac{r_{0011}-\xi_{00}-\eta_{11}}{h}] \\ +\xi_{01}\zeta_{01} & [+\eta_{00}\tan^{-1}\frac{r_{0100}-\xi_{01}-\eta_{00}}{h} & -\eta_{01}\tan^{-1}\frac{r_{0101}-\xi_{01}-\eta_{01}}{h} & -\eta_{10}\tan^{-1}\frac{r_{0110}-\xi_{01}-\eta_{10}}{h} & -\eta_{11}\tan^{-1}\frac{r_{0111}-\xi_{01}-\eta_{11}}{h}] \\ +\xi_{10}\zeta_{10} & [+\eta_{00}\tan^{-1}\frac{r_{1000}-\xi_{10}-\eta_{00}}{h} & -\eta_{01}\tan^{-1}\frac{r_{1001}-\xi_{10}-\eta_{01}}{h} & -\eta_{10}\tan^{-1}\frac{r_{1010}-\xi_{10}-\eta_{10}}{h} & -\eta_{11}\tan^{-1}\frac{r_{1011}-\xi_{10}-\eta_{11}}{h}] \\ -\xi_{11}\zeta_{11} & [+\eta_{00}\tan^{-1}\frac{r_{1100}-\xi_{11}-\eta_{00}}{h} & -\eta_{01}\tan^{-1}\frac{r_{1101}-\xi_{11}-\eta_{01}}{h} & -\eta_{10}\tan^{-1}\frac{r_{1110}-\xi_{11}-\eta_{10}}{h} & -\eta_{11}\tan^{-1}\frac{r_{1111}-\xi_{11}-\eta_{11}}{h}] \end{Bmatrix} \Big\}_A$$

$$\begin{Bmatrix} -(h+\xi_{00}\zeta_{00}/2h) & [+\eta_{00}\tan^{-1}\frac{r_{0000}+\xi_{00}-\eta_{00}}{h} & -\eta_{01}\tan^{-1}\frac{r_{0001}+\xi_{00}-\eta_{01}}{h} & -\eta_{10}\tan^{-1}\frac{r_{0010}+\xi_{00}-\eta_{10}}{h} & -\eta_{11}\tan^{-1}\frac{r_{0011}+\xi_{00}-\eta_{11}}{h}] \\ -(h+\xi_{01}\zeta_{01}/2h) & [+\eta_{00}\tan^{-1}\frac{r_{0100}+\xi_{01}-\eta_{00}}{h} & -\eta_{01}\tan^{-1}\frac{r_{0101}+\xi_{01}-\eta_{01}}{h} & -\eta_{10}\tan^{-1}\frac{r_{0110}+\xi_{01}-\eta_{10}}{h} & -\eta_{11}\tan^{-1}\frac{r_{0111}+\xi_{01}-\eta_{11}}{h}] \\ +(h+\xi_{10}\zeta_{10}/2h) & [+\eta_{00}\tan^{-1}\frac{r_{1000}+\xi_{10}-\eta_{00}}{h} & -\eta_{01}\tan^{-1}\frac{r_{1001}+\xi_{10}-\eta_{01}}{h} & -\eta_{10}\tan^{-1}\frac{r_{1010}+\xi_{10}-\eta_{10}}{h} & -\eta_{11}\tan^{-1}\frac{r_{1011}+\xi_{10}-\eta_{11}}{h}] \\ -(h+\xi_{11}\zeta_{11}/2h) & [+\eta_{00}\tan^{-1}\frac{r_{1100}+\xi_{11}-\eta_{00}}{h} & -\eta_{01}\tan^{-1}\frac{r_{1101}+\xi_{11}-\eta_{01}}{h} & -\eta_{10}\tan^{-1}\frac{r_{1110}+\xi_{11}-\eta_{10}}{h} & -\eta_{11}\tan^{-1}\frac{r_{1111}+\xi_{11}-\eta_{11}}{h}] \end{Bmatrix} \Big\}_B$$

$$+1/4\begin{Bmatrix} -(\eta_{00}^2-h^2) \\ -(\eta_{01}^2-h^2) \\ -(\eta_{10}^2-h^2) \\ -(\eta_{11}^2-h^2) \end{Bmatrix} \begin{bmatrix} \ln(r_{0000}+\xi_{00}_{01})-\ln(r_{0100}+\xi_{01}_{01})-\ln(r_{1000}+\xi_{10}_{01})+\ln(r_{1100}+\xi_{11}_{01}) \\ \ln(r_{0001}+\xi_{00}_{01})-\ln(r_{0101}+\xi_{01}_{01})-\ln(r_{1001}+\xi_{10}_{01})+\ln(r_{1101}+\xi_{11}_{01}) \\ \ln(r_{0010}+\xi_{00}_{10})-\ln(r_{0110}+\xi_{01}_{10})-\ln(r_{1010}+\xi_{10}_{10})+\ln(r_{1110}+\xi_{11}_{10}) \\ \ln(r_{0011}+\xi_{00}_{11})-\ln(r_{0111}+\xi_{01}_{11})-\ln(r_{1011}+\xi_{10}_{11})+\ln(r_{1111}+\xi_{11}_{11}) \end{bmatrix}$$

$$+1/2\begin{bmatrix} +\xi_{00}\zeta_{00} \\ -\xi_{01}\zeta_{01} \\ -\xi_{10}\zeta_{10} \\ +\xi_{11}\zeta_{11} \end{bmatrix} \begin{bmatrix} \ln(r_{0000}+\eta_{00})-\ln(r_{0001}+\eta_{01})-\ln(r_{0010}+\eta_{10})+\ln(r_{0011}+\eta_{11}) \\ \ln(r_{0100}+\eta_{00})-\ln(r_{0101}+\eta_{01})-\ln(r_{0110}+\eta_{10})+\ln(r_{0111}+\eta_{11}) \\ \ln(r_{1000}+\eta_{00})-\ln(r_{1001}+\eta_{01})-\ln(r_{1010}+\eta_{10})+\ln(r_{1011}+\eta_{11}) \\ \ln(r_{1100}+\eta_{00})-\ln(r_{1101}+\eta_{01})-\ln(r_{1110}+\eta_{10})+\ln(r_{1111}+\eta_{11}) \end{bmatrix}\Big\}_C$$

$$\begin{matrix} -(4\xi_{00}-2\xi_{00})[\zeta_{00}\eta_{00}\ln(r_{0000}-\eta_{00})+\xi_{00}\eta_{01}\ln(r_{0001}+\eta_{01})-\eta_{10}\ln(r_{0010}-\eta_{10})+\eta_{11}\ln(r_{0011}+\eta_{11})-\zeta_{00}\eta_{01}\ln(r_{0001}-\eta_{11})] \\ +(4\xi_{01}-2\xi_{01})[\zeta_{01}\eta_{00}\ln(r_{0100}+\eta_{00})-\xi_{01}\eta_{01}\ln(r_{0101}-\eta_{01})-\eta_{10}\ln(r_{0110}+\eta_{10})-\eta_{11}\ln(r_{0111}-\eta_{11})-\zeta_{01}\eta_{11}\ln(r_{0111}-\eta_{11})] \\ +(4\xi_{10}-2\xi_{10})[\zeta_{10}\eta_{00}\ln(r_{1000}-\eta_{00})-\xi_{10}\eta_{01}\ln(r_{1001}+\eta_{01})-\eta_{10}\ln(r_{1010}-\eta_{10})+\eta_{11}\ln(r_{1011}+\eta_{11})-\zeta_{10}\eta_{10}\ln(r_{1010}-\eta_{11})] \\ -(4\xi_{11}-2\xi_{11})[\zeta_{11}\eta_{00}\ln(r_{1100}+\eta_{00})-\xi_{11}\eta_{01}\ln(r_{1101}-\eta_{01})+\eta_{10}\ln(r_{1110}+\eta_{10})-\eta_{11}\ln(r_{1111}-\eta_{11})+\zeta_{11}\eta_{11}\ln(r_{1111}-\eta_{11})] \end{matrix}$$

$$+1/4\begin{bmatrix} +(\xi_{00}^2\zeta_{00}) \\ -(\xi_{01}^2\zeta_{01}) \\ -(\xi_{10}^2\zeta_{10}) \\ +(\xi_{11}^2\zeta_{11}) \end{bmatrix} \begin{bmatrix} (+r_{0000}-r_{0001}-r_{0010}+r_{0011}) \\ (+r_{0100}-r_{0101}-r_{0110}+r_{0111}) \\ (+r_{1000}-r_{1001}-r_{1010}+r_{1011}) \\ (+r_{1100}-r_{1101}-r_{1110}+r_{1111}) \end{bmatrix}\Big\}_D$$

FIG. 21

METHOD AND APPARATUS FOR CALCULATING ELECTROMAGNETIC FIELD INTENSITY, AND A COMPUTER-READABLE RECORDING MEDIUM

FIELD OF THE INVENTION

The present invention relates to an apparatus for calculating the electromagnetic field intensity that calculates the electromagnetic field intensity by dividing a target device into a plurality of patches based on a moment method and using a mutual impedance or a mutual admittance between the patches, and a method for calculating the electromagnetic field intensity. Further, this invention also relates to a computer-readable recording medium in which programs for allowing a computer to execute the method for calculating the electromagnetic field intensity are recorded. More particularly, this invention relates to a technology of calculating the electromagnetic field intensity with which the mutual impedance and the mutual admittance between the patches can be calculated efficiently and at high speed.

BACKGROUND OF THE INVENTION

In simulating the intensity of an electromagnetic wave radiated from an object in the conventional art, there has been frequently used a moment method, i.e., one of integration methods derived from the Maxwell's electromagnetic wave equation, in which an electric current or a magnetic current is calculated by dividing the object into small elements.

FIG. 1 shows how the electromagnetic field intensity is calculated in the moment method. As shown in this figure, a target device is modeled as the set of minute dipoles, and then, the electromagnetic field intensity is obtained by calculating a mutual impedance between a pair of dipoles.

Specifically, mutual impedance $Z_{dipole}$ between a pair of dipoles is computed based on the following equation:

$$Z_{dipole} = Z_{00} + Z_{01} + Z_{10} + Z_{11}$$

Therefore, in order to obtain the mutual impedance between the dipoles, it is necessary to obtain a mutual impedance between monopoles.

FIG. 2 shows how the mutual impedance is calculated conventionally. As shown in this figure, a patch is considered as the set of linear conductors (monopoles), and mutual impedance $Z^{ij}$ between the monopoles is computed.

The mutual impedance $z^{ij}$ includes four kinds of mutual impedances $Z^{ij}_{00}$, $Z^{ij}_{01}$, $Z^{ij}_{10}$ and $Z^{ij}_{11}$ corresponding to the positions of patches adjacent to a patch 1 and a patch 2, so that the mutual impedance $Z^{ij}$ between the monopoles is expressed by a double integration along each of the monopoles as follows:

$$Z_{ij} = \int\int \{(\mu/4\pi)I_iI_j + (1/4\pi\epsilon)q_iq_j\}e^{-jkt}/r dxdX \qquad (1)$$

wherein $I_i$, $I_j$ represent electric currents flowing in monopoles i and j and $q_i$ and $q_j$ represent charge distribution; $\int\int$ represents double integration in which the result obtained by integration from x0 to x1 is further integrated from X0 to X1; $I_i$ and $q_i$ are functions of x; and $I_j$ and $q_j$ are functions of X.

The above-described double integration is calculated using the exponential integration method or the fast reaction matching moment method (hereinafter referred to as FRM method) disclosed in Japanese Patent Application Laid-open No.11-15184. Subsequently, integration is performed using the Gauss integration method for every patch along the direction in which the monopoles forming the patch are aligned. The Gauss integration method is one kind of numerical integration method in which the portion where integration is performed is divided into elements, and the resultant divided elements each are multiplied by an appropriate weight, to be added together.

In calculating the mutual impedance between the patches, the number of divided patch elements corresponds to the number of monopoles constituting the patch, and depends upon the shape of the patch and the distance between the patches. The greater the number of divided patch elements, the more accurate will be the calculation. However, since the number of additions of the mutual impedances between the monopoles is increased, a time required for the calculation becomes longer.

For example, in the case shown in FIG. 2, the mutual impedance between the patch 1 and the patch 2 is computed using the following equation:

$$Z_{ij} = \int\int \int\int \{(\mu/4 z)I_iI_j + (1/4\pi\epsilon)q_iq_j\} dxdXdydY \qquad (2)$$

wherein $\int\int \int\int$ represents quadruple integration in which the result obtained by integration from x0 to x1 is integrated from X0 to X1, and then, the result obtained by further integrating the above-integrated result from y0 to y1 is further integrated from Y0 to Y1.

In this way, the mutual impedance between the patches is calculated by obtaining the sum of the mutual impedances between the monopoles constituting the patch, thereby making it possible to calculate the electromagnetic field intensity.

However, when the electromagnetic field of the electromagnetic wave radiated from the model is obtained with high accuracy in the above-described conventional art, there is a problem that the number of patches constituting the model becomes great, so that the numerical integration (the Gauss integration) requiring a considerable time must be repeated, resulting in the necessity of an interminable processing time.

Particularly, on the assumption of a large-scaled model close to the actual situation, the number of patches constituting the model is markedly increased, requiring an interminable time for the Gauss integration. This is not practical.

Thus, when the electromagnetic field intensity is to be computed by using the moment method, it is remarkably important to efficiently compute the mutual impedance between the patches at a high speed.

When dielectric patches are used instead of metal patches, it is required to calculate the mutual admittance of the electric current flow and the magnetic current of the dielectric surface, consequently increasing the time taken to calculate the electromagnetic field. Therefore, it is remarkably important to efficiently compute the mutual admittance at high speed.

SUMMARY OF THE INVENTION

It is an object of this invention to provide an electromagnetic field intensity calculating apparatus which can efficiently compute a mutual admittance and a mutual impedance between patches at a high speed in the case where an electromagnetic field intensity is computed by using a moment method, an electromagnetic field intensity calculating method, and a computer-readable recording medium in which programs for allowing a computer to execute the electromagnetic field intensity calculation method are recorded.

According to one aspect of this invention, the mutual impedance between the patches can be efficiently computed at a high speed since it is computed based on the previously computed analytic solutions of the quadruple integration under the condition that the patches are rectangular in shape and are parallel or perpendicular to each other and the electromagnetic field intensity is calculated based on the computed mutual impedance.

According to another aspect of this invention, the mutual admittance between the patches can be efficiently computed at a high speed since it is computed based on the previously computed analytic solutions of the quadruple integration under the condition that the patches are rectangular in shape and are parallel or perpendicular to each other and the electromagnetic field intensity is calculated based on the computed mutual admittance.

A still another aspect of the invention provides a computer-readable recording medium in which are recorded programs for allowing a computer to execute an electromagnetic field intensity calculating method for calculating electromagnetic field intensity. According to this invention, a computer can execute the operations of computing the mutual impedance between the patches based on the previously computed analytic solutions of the quadruple integration under the condition that the patches are rectangular in shape and are parallel or perpendicular to each other and calculating the electromagnetic field intensity based on the computed mutual impedance.

Other objects and features of this invention will become apparent from the following description with reference to the accompanying drawings.

BRIEF DESCRIPTION OF THE DRAWINGS

FIG. 6 shows one example of analytic solutions of the mutual impedance in the case shown in FIG. 5A;

FIG. 8 shows how the electromagnetic wave radiated from a dielectric patch are calculated;

FIG. 14 shows one example of analytic solutions of a mutual admittance;

FIG. 15 shows one example of expansion using partial numerical integration;

FIG. 20 shows a comparison between a case where a quadruple integration is calculated using analysis and a case where a quadruple integration is calculated using the Gauss integration method (the conventional method); and FIG. 21 shows one example of another analysis of mutual admittance.

DESCRIPTION OF THE PREFERRED EMBODIMENTS

The method and apparatus for calculation of the electromagnetic field intensity and a computer-readable recording medium in which programs for allowing a computer to execute the method are recorded in preferred embodiments according to the present invention will be described in detail below in reference to the drawings. In the present embodiments, this invention is applied to the above-described FRM method. A case when mutual impedance is computed is described as a first embodiment, and a case when mutual admittance is computed is described as a second embodiment.

Figure 1:
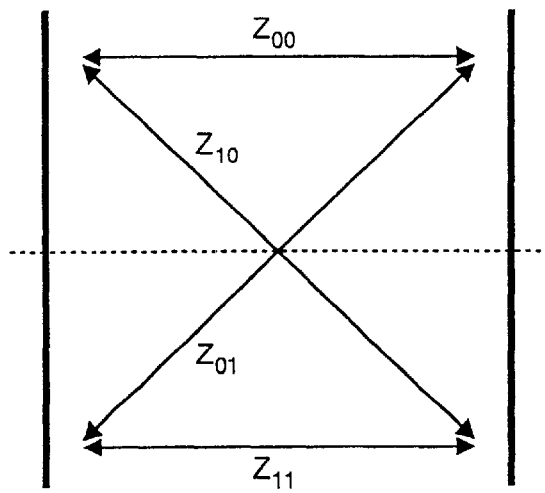
FIG. 1 shows how the intensity of the electromagnetic field is calculated in the moment method.
Figure 2:
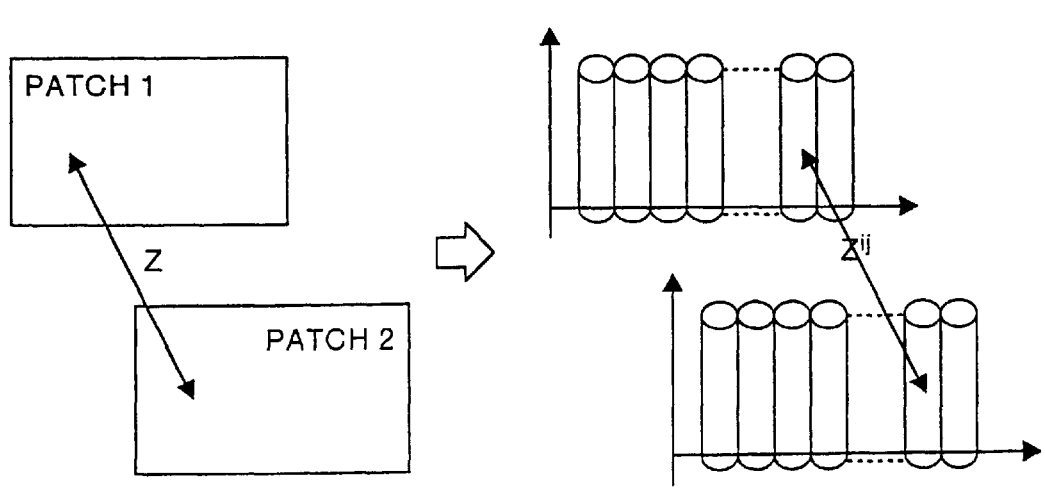
FIG. 2 shows how the mutual impedance is calculated conventionally.
Figure 3:
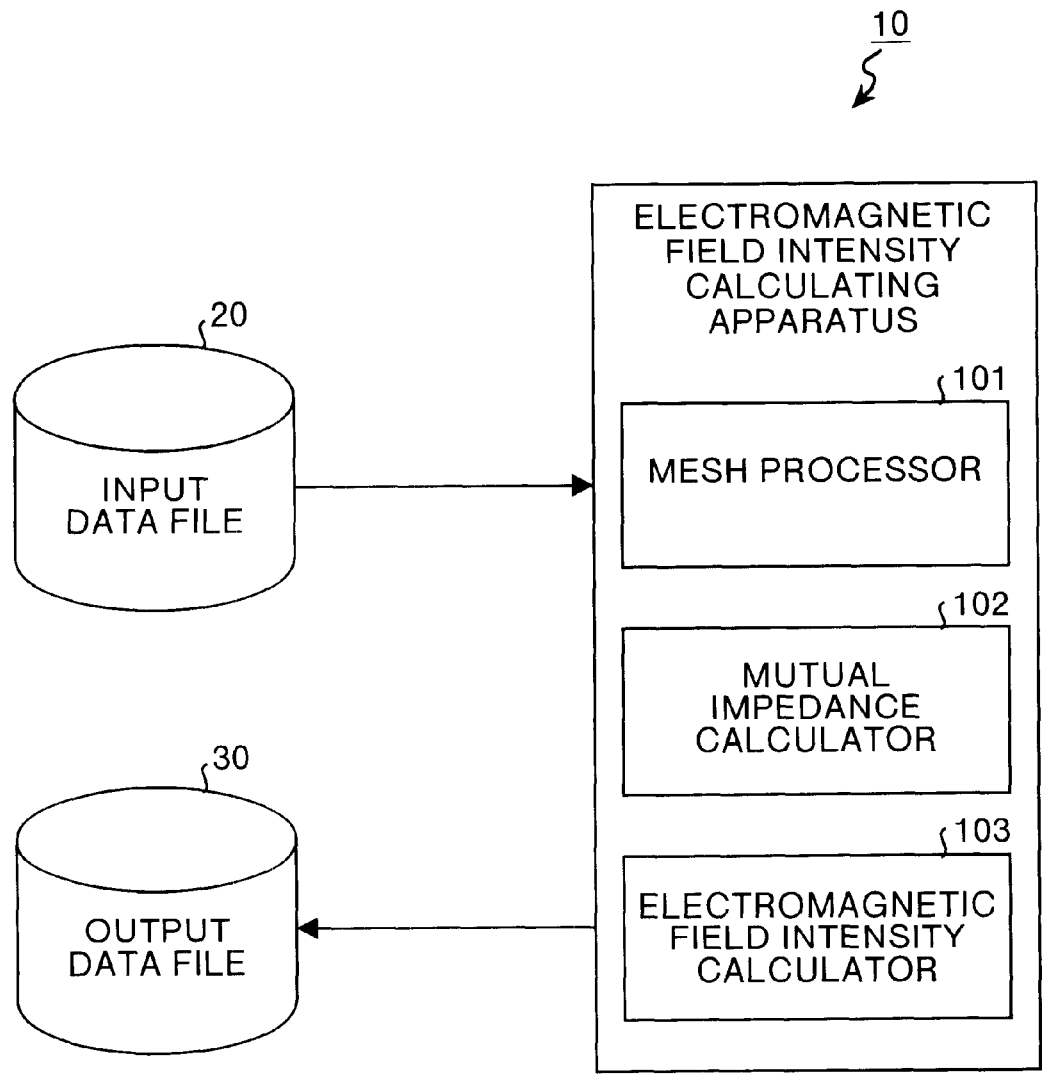
FIG. 3 is a block diagram showing the configuration of an electromagnetic field intensity calculating apparatus used in a first preferred embodiment.

FIG. 3 is a block diagram showing the configuration of an electromagnetic field intensity calculating apparatus used in the first embodiment. The electromagnetic field intensity calculating apparatus 10 shown in FIG. 3 is an apparatus which simulates the electromagnetic field intensity of electromagnetic wave radiated from electronic equipment to be analysed by using the moment method and calculates a mutual impedance between patches at a high speed by using not a numerical integration method (the Gauss integration method) requiring a long processing time but analytic solutions of a quadruple integration.

As shown in FIG. 3, the electromagnetic field intensity calculating apparatus 10 comprises a mesh processor 101, a mutual impedance calculator 102, an electromagnetic field intensity calculator 103, an input data file 20 and an output data file 30.

The input data file 20 is a file that stores information on the configuration of the electronic equipment to be analysed. The output data file 30 is a file that stores the electromagnetic field intensity of a simulation result.

The mesh processor 101 is a processor which divides the electronic equipment to be analysed, whose information has been stored in the input data file 20, into a plurality of patch elements. The mutual impedance calculator 102 is a processor which calculates a mutual impedance between patches by using the FRM method at high speed by using analytic solutions of a quadruple integration.

The electromagnetic field intensity calculator 103 is a processor which solves a plurality of simultaneous equations representing the relationships between mutual impedances between dipole antennas calculated by the mutual impedance calculator 102 and voltages applied to the antennas so as to obtain electric currents flowing in the elements, and then, calculates the intensity of the radiated electromagnetic field based on the calculated electric currents.

The mesh processor 101, the mutual impedance calculator 102 and the electromagnetic field intensity calculator 103 may be installed as electromagnetic field intensity calculating programs in the electromagnetic field intensity calculating apparatus 10.

Subsequently, the calculation of the mutual impedance by the mutual impedance calculator 102 shown in FIG. 3 will be explained below. It is assumed that the distribution of an electric current flowing on a monopole is of a ramp type in which the electric current is linearly increased or decreased as shown in a graph of FIG. 4.

Figure 4:
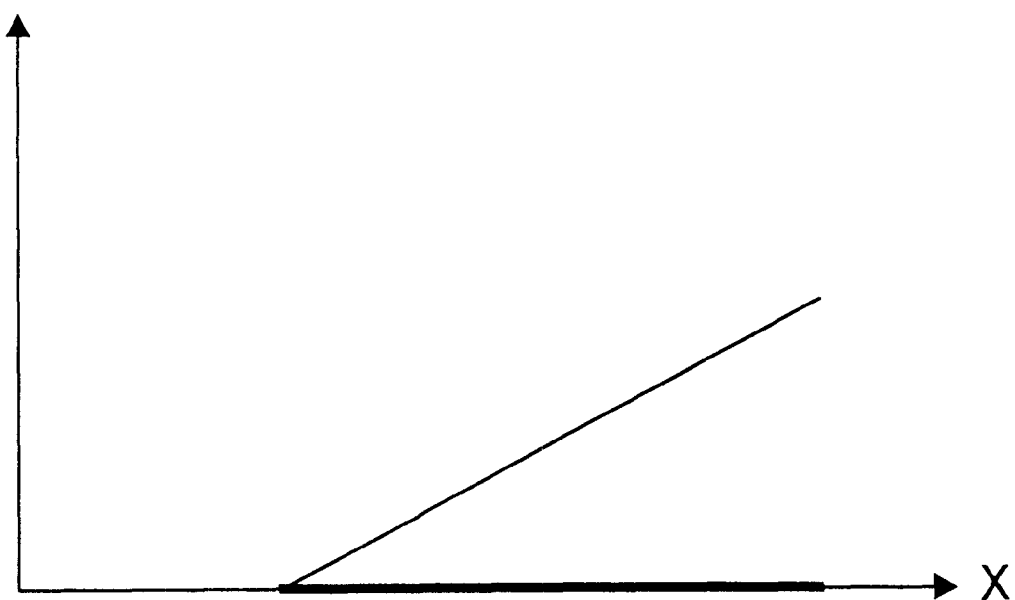
FIG. 4 is a graph showing the distribution of an electric current flowing on a monopole, which is assumed in the first embodiment.

With the electric current distribution of a ramp type as shown in FIG. 4, the mutual impedance $Z_{ij}$ expressed by the equation (2) is modified as follows:

$$Z_{ij} = j(\mu/\epsilon)^{0.5}(4\pi li lj)^{-1} \int\int \int\int \{(xi-xj)(Xi-Xj)\cos\phi + k^{-2}\} e^{-jkr}/r \, dxdXdydY \quad (3)$$

wherein li and lj represent the lengths of a monopole i and a monopole j, respectively; $\phi$ is the angle between the monopole i and the monopole j; and $\int\int \int\int$ represents quadruple integration in which the result obtained by integration from x0 to x1 is integrated from X0 to X1, and then, the result obtained by further integrating the above-integrated result from y0 to y1 is further integrated from Y0 to Y1.

If both of the metal patches, the mutual impedance between which is to be obtained, are rectangular and they are parallel or perpendicular to each other, then the equation (3) can be analytically obtained by changing the coordinate systems.

Figure 5A:
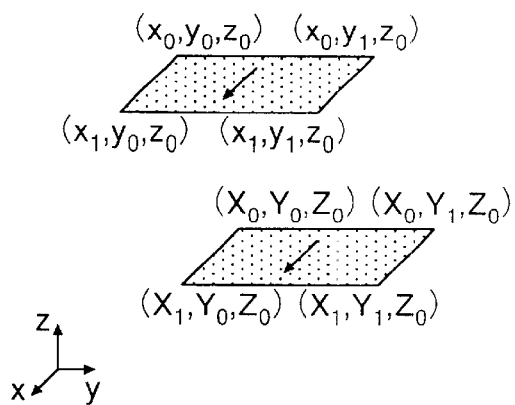
FIG. 5A to FIG. 5E show patterns representing the positional relationship between two rectangular metal patches.
Figure 5B:
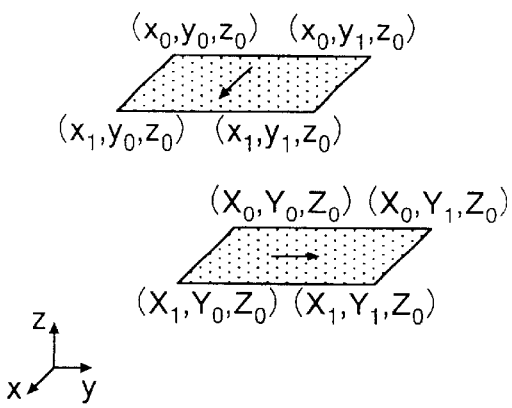
Figure 5C:
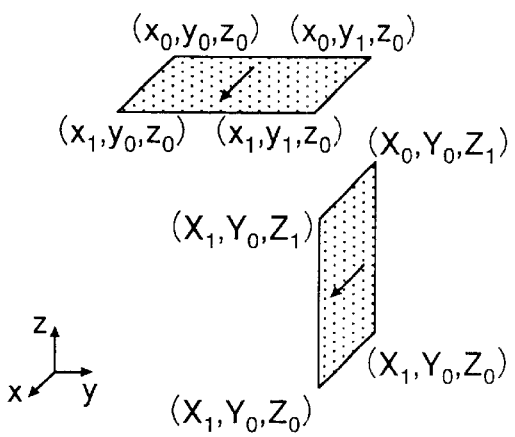
Figure 5D:
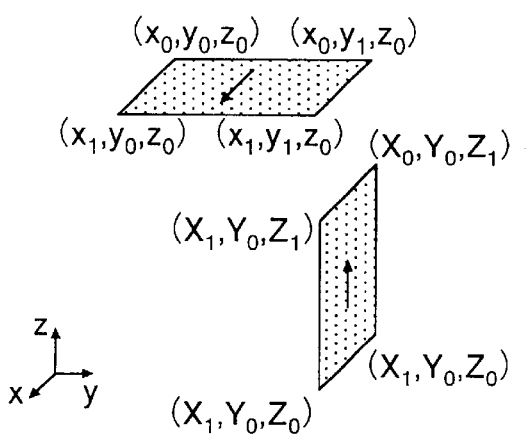
Figure 5E:
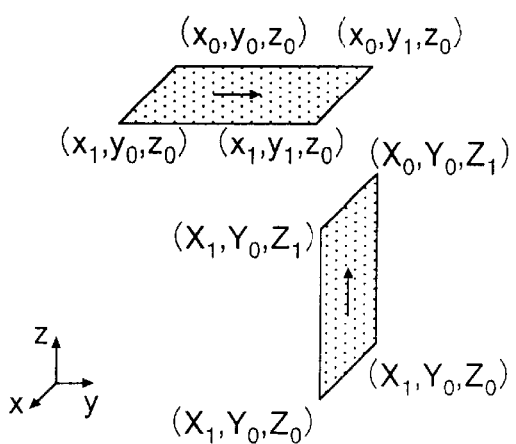

FIG. 5A to FIG. 5E show patterns representing the positional relationship between the two rectangular metal patches. FIG. 5A shows a case where the two metal patches are parallel to each other at an angle $\phi$ of 0°; FIG. 5B shows a case where the two metal patches are parallel to each other at an angle $\phi$ of 90°; FIG. 5C shows a case where the two metal patches are perpendicular to each other at an angle $\phi$ of 0°; and FIG. 5D and FIG. 5E shows cases where the two metal patches are perpendicular to each other at an angle $\phi$ of 90°.

For the case shown in FIG. 5A, the mutual impedances $Z_{00}$, $Z_{01}$, $Z_{10}$ and $Z_{11}$ may be calculated as follows, wherein $$\xi = x-X,\ \eta = y-Y,\ h = z0-Z0,\ r = (\xi^2+\eta^2+h^2)^{1/2}$$

For $Z_{00}$:

$r0 = [(x0-X0)^2 + \{(y0+y1)/2 - (Y0+Y1)/2\}^2 + h^2]^{1/2}$ $Z_{00} = \{(\mu/\epsilon)^{1/2}\exp(-jkr0)/4\pi(x0-x1)(X0-X1)(y1-y0)$ $(Y1-Y0)\} \times \int\int \int\int [r0/(r-1) + k^2\{(x-x1)(X-X1)$ $-(xX-xX1-x1X+x1X1)r0/r + (r^2-3r0r+3r0^2-r0^3/r)/6\}$ $-j/kr + jk\{(xX-xX1-x1X+x1X1)/r$ $+(r-2r0+r0^2/r)/2\}]dxdXdydY$ For $Z_{01}$:

$r0 = [(x0-X1)^2 + \{(y0+y1)/2 - (Y0+Y1)/2\}^2 + h^2]^{1/2}$ $Z_{01} = \{(\mu/\epsilon)^{1/2}\exp(-jkr0)/4\pi(x0-x1)(X1-X0)(y1-y0)$ $(Y1-Y0)\} \times \int\int \int\int [r0/(r-1) + k^2\{(x-x1)(X-X0)$ $-(xX-xX0-x1X+x1X0)r0/r$ $+(r^2-3r0r+3r0^2-r0^3/r)/6\}-j/kr$ $+jk\{(xX-xX0-x1X+x1X0)/r$ $+(r-2r0+r0^2/r)/2\}]dxdXdydY$ For $Z_{10}$:

$r0 = [(x1-X0)^2 + \{(y0+y1)/2 - (Y0+Y1)/2\}^2 + h^2]^{1/2}$ $Z_{10} = \{(\mu/\epsilon)^{1/2}\exp(-jkr0)/4\pi(x1-x0)(X0-X1)(y1-y0)$ $(Y1-Y0)\} \times \int\int \int\int [r0/(r-1) + k^2\{(x-x0)(x-X1)$ $-(xX-xX1-x0X+x0X1)r0/r + (r^2-3r0r+3r0^2-r0^3/r)/6\}$ $-j/kr + jk\{(xX-xX1-x0X+x0X1)/r$ $+(r-2r0+r0^2/r)/2\}]dxdXdydY$ For $Z_{11}$:

$r0 = [(x1-X1)^2 + \{(y0+y1)/2 - (Y0+Y1)/2\}^2 + h^2]^{1/2}$ $Z_{11} = \{(\mu/\epsilon)^{1/2}\exp(-jkr0)/4\pi(x1-x0)(X1-X0)(y1-y0)$ $(Y1-Y0)\} \times \int\int \int\int [r0/(r-1) + k^2\{(x-x0)(x-X0)$ $-(xX-xX0-x0X+x0X0)r0/r$ $+(r^2-3r0r+3r0^2-r0^3/r)/6\}-j/kr$ $+jk\{(xX-xX0-x0X+x0X0)/r$ $+(r-2r0+r0^2/r)/2\}]dxdXdydY$ Here, $\int\int \int\int$ represents quadruple integration in which the result obtained by integration from x0 to x1 is integrated from X0 to X1, and then, the result obtained by further integrating the above-integrated result from y0 to y1 is further integrated from Y0 to Y1.

For the case shown in FIG. 5B, the mutual impedances $Z_{00}$, $Z_{01}$, $Z_{10}$ and $Z_{11}$ may be calculated using the following equations, wherein $$\xi = x-X,\ \eta = y-Y,\ h = z0-Z0,\ r = (\xi^2+\eta^2+h^2)^{1/2}$$

For $Z_{00}$:

$r0 = [\{x0-(X0+X1)/2\}^2 + \{(y0+y1)/2 - Y0\}^2 + h^2]^{1/2}$ $Z_{00} = \{(\mu/\epsilon)^{1/2}\exp(-jkr0)/4\pi(x0-x1)(X1-X0)(y1-y0)$ $(Y0-Y1)\} \times \int\int 0 \int\int [r0/(r-1)$ $+k^2\{(r^2-3r0r+3r0^2-r0^3/r)/6\}$ $-j/kr + jk\{(r-2r0+r0^2/r)/2\}]dxdXdydY$ For $Z_{01}$:

$r0 = [\{x-(X0+X1)/2\}^2 + \{(y0+y1)/2 - Y1\}^2 + h^2]^{1/2}$ $Z_{01} = \{(\mu/\epsilon)^{1/2}\exp(-jkr0)/4\pi(x0-x1)(X1-X0)(y1-y0)$ $(Y1-Y0)\} \times \int\int \int\int [r0/(r-1)$ $+k^2\{(r^2-3r0r+3r0^2-r^3/r)/6\}$ $-j/kr + jk\{(r-2r0+r0^2/r)/2\}]dxdXdydY$ For $Z_{10}$:

$$r0=[\{x1-(X0+X1)/2\}^2+\{(y0+y1)/2-Y0\}^2+h^2]^{1/2}$$

$$Z_{10}=\{(\mu/\epsilon)^{1/2}\exp(-jkr0)/4\pi(x1-x0)(X1-X0)(y1-y0)$$

$$(Y1-Y0)\}\times\iint\iint[r0/(r-1)$$

$$+k^2\{(r^2-3r0r+3r0^2-r0^3)/r)/6\}$$

$$-j/kr+jk\{(r-2r0+r0^2/r)/2\}]dxdXdydY$$

For $Z_{11}$:

$$r0=[\{x1-(X0+X1)/2\}^2+\{(y0+y1)/2-Y1\}^2+h^2]^{1/2}$$

$$Z_{11}=\{(\mu/\epsilon)^{1/2}\exp(-jkr0)/4\pi(x1-x0)(X1-X0)(y1-y0)$$

$$(Y1-Y0)\}\times\iint 17 \int[r0/(r-1)$$

$$+k^2\{(r^2-3r0r+3r0^2-r0^3)/r)/6\}$$

$$-j/kr+jk\{(r-2r0+r0^2/r)/2\}]dxdXdydY$$

Here, $\iint\iint$ represents quadruple integration in which the result obtained by integration from x0 to x1 is integrated from X0 to X1, and then, the result obtained by further integrating the above-integrated result from y0 to y1 is further integrated from Y0 to Y1.

For the case shown in FIG. 5C, the mutual impedances $Z_{00}$, $Z_{01}$, $Z_{10}$ and $Z_{11}$ may be calculated as follows, wherein $$\xi=x-X,\ y=y-Y,\ Z=Z-z,\ r=(\xi^2+y^2+z^2)^{1/2}$$

For $Z_{00}$:

$$r0=[(x0-X0)^2+\{(y0+y1)/2-Y0\}^2+\{(z0-(Z0+Z1)/2\}^2]^{1/2}$$

$$Z_{00}=\{(\mu/\epsilon)^{1/2}\exp(-jkr0)/4\pi(x0-x1)(X0-X1)(y1-y0)$$

$$(Z1-Z0)\times\iint\iint[r0/(r-1)$$

$$+k^2\{(x-x1)(X-X1)-(xX-xX1-x1X+x1X1)r0/r$$

$$+(r^2-3r0r+3r0^2-r0^3)/r)/6-j/kr$$

$$+jk\{(xX-xX1-x1X+x1X1)/r$$

$$+(r-2r0+r0^2/r)/2\}]dxdXdydZ$$

For $Z_{01}$:

$$r0[(x0-X1)^2+\{(y0+y1)/2-Y0\}^2+\{(Z0-(Z0+Z1)/2\}^2]^{1/2}$$

$$Z_{01}=\{(\mu/\epsilon)^{1/2}\exp(-jkr0)/4\pi(x0-x1)(X1-X0)(y1-y0)$$

$$(Z1-Z0)\times\iint\iint[r0/(r-1)+k^2\{(x-x1)(X-X0)$$

$$-(xX-xX0-x1X+x1X0)r0/r$$

$$+(r^2-3r0r+3r0^2-r0^3)/r)/6\}$$

$$-j/kr+jk\{(xX-xX0-x1X+x1X0)/r$$

$$+(r-2r0+r0^2/r)/2\}]dxdXdydZ$$

For $Z_{10}$:

$$r0=[(x1-X0)^2+\{(y0+y1)/2-Y0\}^2+\{(z0-(Z0+Z1)/2\}^2]^{1/2}$$

$$Z_{10}=\{(\mu/\epsilon)^{1/2}\exp(-jkr0)/4\pi(x1-x0)(X0-X1)(y1-y0)$$

$$(Z1-Z0)\}\times\iint\iint[r0/(r-1)$$

$$+k^2\{(x-x0)(X-X1)-(xX-xX1-x0X+x0X1)r0/r$$

$$+(r^2-3r0r+3r0^2-r0^3)/r)/6\}$$

$$-j/kr+jk\{(xX-xX1-x0X+x0X1)/r$$

$$+(r-2r0+r0^2/r)/2\}]dxdXdydZ$$

For $Z_{11}$:

$$r0=[(x1-X1)^2+\{(y0+y1)/2-Y0\}^2+\{(z0-(Z0+Z1)/2\}^2]^{1/2}$$

$$Z_{11}=\{(\mu/\epsilon)^{1/2}\exp(-jkr0)/4\pi(x1-x0)(x1-x0)(y1-y0)$$

$$(Z1-Z0)\}\times\iint\iint[r0/(r-1)$$

$$+k^2\{(x-x0)(X-X0)-(xX-xX0-x0X+x0X0)r0/r$$

$$+(r^2-3r0r+3r0^2-r0^3)/r)/6\}$$

$$-j/kr+jk\{(xX-xX0-x0X+x0X0)/r$$

$$+(r-2r0+r0^2/r)/2\}]dxdXdydZ$$

Here, $\iint\iint$ represents quadruple integration in which the result obtained by integration from x0 to x1 is integrated from X0 to X1, and then, the result obtained by further integrating the above-integrated result from y0-Y0 to y1-Y0 is further integrated from Z0-z0 to Z1-z0.

For the case shown in FIG. 5D, the mutual impedances $Z_{00}$, $Z_{01}$, $Z_{10}$ and $Z_{11}$ may be calculated as follows, wherein $$\xi=x-X,\ y=y-Y,\ Z=Z-z,\ r=(\xi^2+y^2+Z^2)^{1/2}$$

For $Z_{00}$:

$$r0=[(x0-(X0+X1)/2)^2+\{(y0+y1)/2-Y0\}^2+(z0-Z0)^2]^{1/2}$$

$$Z_{00}=\{(\mu/\epsilon)^{1/2}\exp(-jkr0)/4\pi(x0-x1)(X0-X1)(y1-y0)$$

$$(Z1-Z0)\}\times\iint\iint[r0/(r-1)$$

$$+k^2\{(r^2-3r0r+3r0^2-r0^3)/r)/6\}$$

$$-j/kr+jk\{(r-2r0+r0^2/r)/2\}]dxdXdydZ$$

For $Z_{01}$:

$$r0=[(x0-(X0+X1)/2)^2+\{(y0+y1)/2-Y0\}^2+(z0-Z1)^2]^{1/2}$$

$$Z_{01}=\{(\mu/\epsilon)^{1/2}\exp(-jkr0)/4\pi(x0-x1)(X1-X0)(y1-y0)$$

$$(Z1-Z0)\}\times\iint\iint[r0/(r-1)$$

$$+k^2\{(r^2-3r0r+3r0^2-r0^3)/r)/6\}$$

$$-j/kr+jk\{(r-2r0+r0^2/r)/2\}]dxdXdydZ$$

For $Z_{10}$:

$$r0=[(x1-(X0+X1)/2)^2+\{(y0+y1)/2-Y0\}^2+(z0-Z0)^2]^{1/2}$$

$$Z_{10}=\{(\mu/\epsilon)^{1/2}\exp(-jkr0)/4\pi(x1-x0)(X1-X0)(y1-y0)$$

$$(Z0-Z1)\}\times\iint\iint[r0/(r-1)$$

$$+k^2\{(r^2-3r0r+3r0^2-r0^3)/r)/6\}$$

$$-j/kr+jk\{(r-2r0+r0^2/r)/2\}]dxdxdydZ$$

For $Z_{11}$:

$$r0=[(x1-(X0+X1)/2)^2+\{(y0+y1)/2-Y0\}^2+(z0-Z1)^2]^{1/2}$$

$$Z_{11}\{(\mu/\epsilon)^{1/2}\exp(-jkr0)/4\pi(x1-x0)(X1-X0)(y1-y0)$$

$$(Z1-Z0)\}\times\iint\iint[r0/(r-1)$$

$$+k^2\{(r^2-3r0r+3r0^2-r0^3)/r)/6\}$$

$$-j/kr+jk\{(r-2r0+r0^2/r)/2\}]dxdXdydZ$$

Here, $\iint \iint$ represents quadruple integration in which the result obtained by integration from x0 to x1 is integrated from X0 to X1, and then, the result obtained by further integrating the above-integrated result from y0–Y0 to y1–Y0 is further integrated from Z0–z0 to Z1–z0.

For the case shown in FIG. 5E, the mutual impedances $Z_{00}$, $Z_{01}$, $Z_{10}$ and $Z_{11}$ may be calculated as follows, wherein $\xi = x-X$, $y=y-Y$, $Z=Z-z$, $r=(\xi^2+y^2+Z^2)^{1/2}$ For $Z_{00}$:

$r0=[\{(x0+x1)/2-(X0+X1)/2\}^2+(y0-Y0)^2+(z0-Z0)^2]^{1/2}$ $Z_{00}=\{(\mu/\epsilon)^{1/2}\exp(-jkr0)/4\pi(x1-x0)(X1-X0)(y0-y1)$ $(Z0-Z1)\}\times \iint \iint [r0/(r-1)$ $+k^2\{(r^2-3r0r+3r0^2-r0^3)/r\}/6\}$ $-j/kr+jk\{(r-2r0+r^2/r)/2\}]dxdXdydZ$ For $Z_{01}$:

$r0=[\{(x0+x1)/2-(X0+X1)/2\}^2+(y0Y0)^2+(z0-Z1)^2]^{1/2}$ $Z_{01}=\{(\mu/\epsilon)^{1/2}\exp(-jkr0)/4\pi(x1-x0)(X1-X0)(y0-y1)$ $(Z1-Z0)\}\times \iint \iint [r0/(r-1)$ $+k^2\{(r^2-3r0r+3r0^2-r0^3)/r\}/6\}$ $-j/kr+jk\{(r-2r0+r0^2/r)/2\}]dxdXdydZ$ For $Z_{10}$:

$r0=[\{(x0+x1)/2-(X0+X1)/2\}^2+(y1-Y0)/^2+(z0-Z0)^2]^{1/2}$ $Z_{10}=\{(\mu/\epsilon)^{1/2}\exp(-jkr0)/4\pi(x1-x0)(X1-X0)(y1-y0)$ $(Z0-Z1)\}\times \iint \iint [r0/(r-1)$ $+k^2\{(r^2-3r0r+3r0^2-r0^3)/r\}/6\}$ $-j/kr+jk\{(r-2r0+r0^2/r)/2\}]dxdxdydZ$ For $Z_{11}$:

$r0=[\{(x0+x1)/2-(X0+X1)/2\}^2+(y1-Y0)^2+(z0-Z1)^2]^{1/2}$ $Z_{11}=\{(\mu/\epsilon)^{1/2}\exp(-jkr0)/4\pi(x1-x0)(X1-X0)(y1-y0)$ $(Z1-Z0)\}\times \iint \iint [r0/(r-1)$ $+k^2\{(r^2-3r0r+3r0^2-r0^3)/r\}/6\}$ $-j/kr+jk\{(r-2r0+r0^2/r)/2\}]dxdXdydZ$ Here, $\iint \iint$ represents quadruple integration in which the result obtained by integration from x0 to x1 is integrated from X0 to X1, and then, the result obtained by further integrating the above-integrated result from y0–Y0 to y1–Y0 is further integrated from Z0–z0 to Z0–z0.

In this way, when the patches are rectangular in shape and are parallel or perpendicular to each other, the mutual impedances can be obtained based on the above computation equations.

However, if the mutual impedance calculator 102 shown in FIG. 3 performs the calculations expressed by the above equations every time, it requires great processing time, thereby making it impossible to obtain the simulation result within a practical time.

In view of this, the mutual impedance calculator 102 extracts items of the quadruple integration commonly appearing in the computation equations for the mutual impedances Z, and then, speedily obtains the mutual impedances by using the analytic solutions of the quadruple integration.

Specifically, as shown in FIG. 5A and FIG. 5B, in the case where the two metal patches are parallel to each other, there are used five analytic solutions of the quadruple integration expressed as follows:

$\iint \iint (1/r)\, dxdXdydY$ \hfill (4)

$\iint \iint (x/r)\, dxdXdydY$ \hfill (5)

$\iint \iint (X/r)\, dxdXdydY$ \hfill (6)

$\iint \iint (xX/r)\, dxdXdydY$ \hfill (7)

$\iint \iint r\, dxdXdydY$ \hfill (8)

wherein $\xi=x-X$, $\eta=y-Y$, $h=z0-Z0$, $r=(\xi^2+\eta^2+h^2)^{1/2}$; and $\iint \iint$ represents quadruple integration in which the result obtained by integration from x0 to x1 is integrated from X0 to X1, and then, the result obtained by further integrating the above-integrated result from y0 to y1 is further integrated from Y0 to Y1.

In contrast, as shown in FIG. 5C to FIG. 5E, in the case where the two metal patches are perpendicular to each other, there are used five analytic solutions of the quadruple integration expressed as follows:

$\iint \iint (1/r)\, dxdXdydY$ \hfill (9)

$\iint \iint (x/r)\, dxdXdydY$ \hfill (10)

$\iint \iint (X/r)\, dxdXdydY$ \hfill (11)

$\iint \iint (xX/r)\, dxdXdydY$ \hfill (12)

$\iint \iint r\, dxdXdydY$ \hfill (13)

wherein $\xi=x-X$, $y=y-Y$, $Z=Z-z$, $r=(\xi^2+y^2+Z^2)^{1/2}$; and $\iint \iint$ represents quadruple integration in which the result obtained by integration from x0 to x1 is integrated from X0 to X1, and then, the result obtained by further integrating the above-integrated result from y0 to y1 is further integrated from Z0 to Z1.

Consequently, if the analytic solutions of the quadruple integration expressed by the above equations (4) to (13) are obtained previously, the mutual impedance between the metal patches can be speedily obtained. Since in the actual calculation there exist common factors in the analytic solutions expressed by the equations (4) to (13), previous computation of the common factors can increase the speed more.

The analytic solution expressed by the equations (4) becomes as shown in FIG. 6, and basically, it can be expressed as the functions of r, $\xi$ and $\eta$. Therefore, the analytic solution expressed by the equations (4) can be obtained relatively easily. The same goes for the analytic solutions expressed by the other equations (5) to (13), although its detailed description will be omitted for the convenience of the explanation.

Subsequently, the computation of the mutual impedance by using the analytic solutions expressed by the equations (4) to (13) will be described below. For the sake of convenience, representative description will be given below of the case where the mutual impedance $Z_{00}$ in FIG. 5A is computed by using the equations (4) to (8).

As described already, the mutual impedance $Z_{00}$ in this case becomes as follows:

$Z_{00}=\{(\mu/\epsilon)^{1/2}\exp(-jkr0)/4\pi(x0-x1)($ $X0-X1)(y1-y0)$ $(Y1-Y0)\}\times\int\int\int\int[r0/(r-1)+k^2\{(x-x1)(X-X1)$ $-(xX-xX1-x1X+x1X1)r0/r$ $+(r^2-3r0r+3r0^2-r0^3/r)/6\}$ $-j/kr+jk\{(xX-xX1-x1X+x1X1)/r$ $+(r-2r0+r0^2/r)/2\}]dxdXdydY$ (14)

Assuming that the above equations (4) to (8) are expressed as follows:

$A=\int\int\int\int(1/r)\,dxdXdydY$ $B=\int\int\int\int(x/r)\,dxdXdydY$ $C=\int\int\int\int(X/r)\,dxdXdydY$ $D=\int\int\int\int(xX/r)\,dxdXdydY$ $E=\int\int\int\int rdxdXdydY$ the equation (14) may be modified as follows:

$Z_{00}=\{(\mu/\epsilon)^{1/2}\exp(-jkr0)/4\pi(X0-X1)($ $X0-X1)(y1-y0)$ $(Y1-Y0)\}\times[r0A-k^2r0(D-X1B-x1C+x1X1A)$ $-k^2r0E/2-k^2r0^3A/6-jA/k$ $+jk(D-X1B-x1C+x1X1A)+jk\{(E+r0^2A)/2\}]$ $+\{(\mu/\epsilon)^{1/2}\exp(-jkr0)/4\pi(x0-x1)(X0-X1)(y1-y0)$ $(Y0-Y0)\}\times\int\int\int\int[-1+k^2\{(XX-xX1-x1X+x1X1)$ $+(r^2+3r0^2)/6\}jkr0]dxdXdydY$ Therefore, as described above, the mutual impedance $Z_{00}$, can be speedily computed as long as even the analytic solutions A to D in the equations (4) to (8) are obtained.

Figure 7:
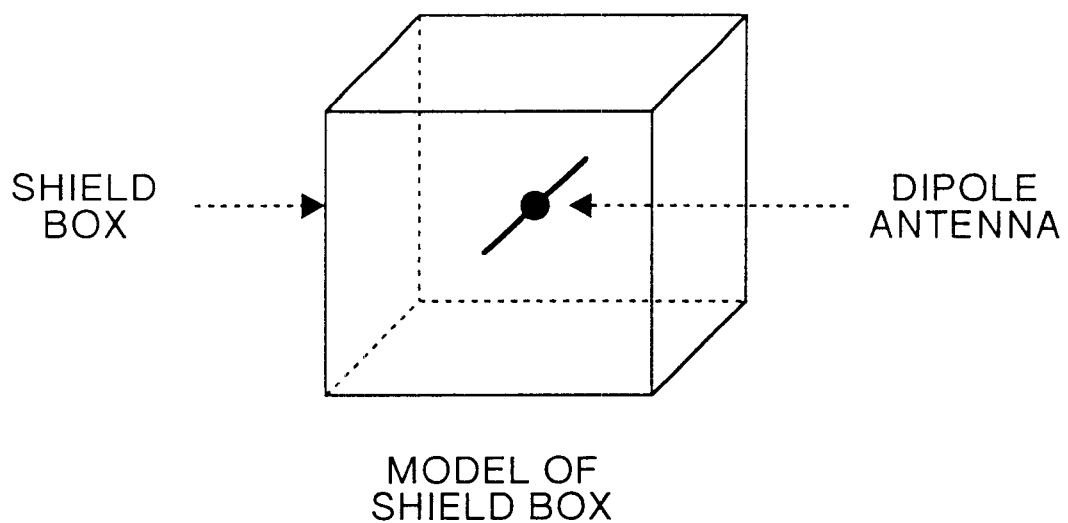
FIG. 7 is a view showing a model of a shield box.

As described above, the electromagnetic field intensity calculating apparatus 10 in the first embodiment is configured as follows. That is, the mesh processor 101 divides the target device into the plurality of patches; the mutual impedance calculator 102 computes the mutual impedance between the patches based on the previously computed analytic solutions of the quadruple integration under the condition that the patches are rectangular in shape and are parallel or perpendicular to each other; and the electromagnetic field intensity calculator 103 calculates the electromagnetic field intensity based on the computed mutual impedance. Thus, it is possible to compute the mutual impedance between the patches at a high speed, and further, to calculate the electromagnetic field intensity in a practical time even if large-scaled equipment is to be analyzed. Incidentally, in analyzing a model of a shield box shown in FIG. 7, the electromagnetic field intensity could be calculated at about twice as high a speed as that in the conventional method.

In the first embodiment described above, mutual impedance between the metal patches was obtained. However, when dielectric patches are used, it is assumed that there is a magnetic current (M) in addition to the electric current (J) on the dielectric surfaces, and it consequently is necessary to calculate a mutual admittance between the magnetic current and the electric current.

FIG. 8A and FIG. 8B show how the electromagnetic wave radiated from a dielectric patch are calculated. Assuming a model having a specific inductive capacity $\epsilon r$ as shown in FIG. 8A, according to the conventional technology (IEEE Transaction on Antennas and Propagation, Vol. AP-34, No. 8, August 1986, p969), the electric current I and magnetic current M flowing over the model can be obtained by solving the matrix equation shown in FIG. 8B. These can be used to compute the electromagnetic wave radiated from the model. In FIG. 8B, Z represents the mutual impedance between electric currents, and Y represents the mutual admittance between the magnetic current and the electric current.

Figure 9:
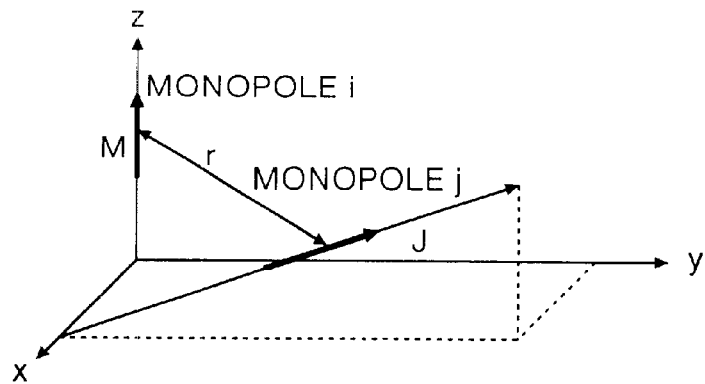
FIG. 9 is a view showing a model for computing a mutual admittance between monopoles.

The mutual admittance between an electric current patch and a magnetic patch is computed. Firstly, with a coordinate system such as that shown in FIG. 9, the mutual admittance between the monopoles is $Y_{ij}=(1/4\pi)\int_{z0}^{z1}M\cdot Hdz$ $=(1/4\pi)\int_{z0}^{z1}M\cdot\nabla\times\int_{t0}^{t1}J\cdot(e^{-jkr}/r)dzdt$ wherein a magnetic current M flows over the monopole i, and an electric current J flows on the monopole j; H represents a magnetic field generated at the position of the monopole i by electric current flowing on the monopole j; and r represents the distance between the monopoles. In this way, the mutual admittance between the monopoles is expressed by a double integration along each of the monopoles.

Subsequently, integration is performed using the Gauss integration method for every patch along the direction in which the monopoles forming the patch are aligned. For example, in the case shown in FIG. 10, the mutual admittance between patches 1 and 2 is $Yij=(1/4\pi)\int\int\ \int\int M\cdot\nabla J\times\cdot(e^{-jkr}/r)dxdxdydz$ (15)

Figure 10:
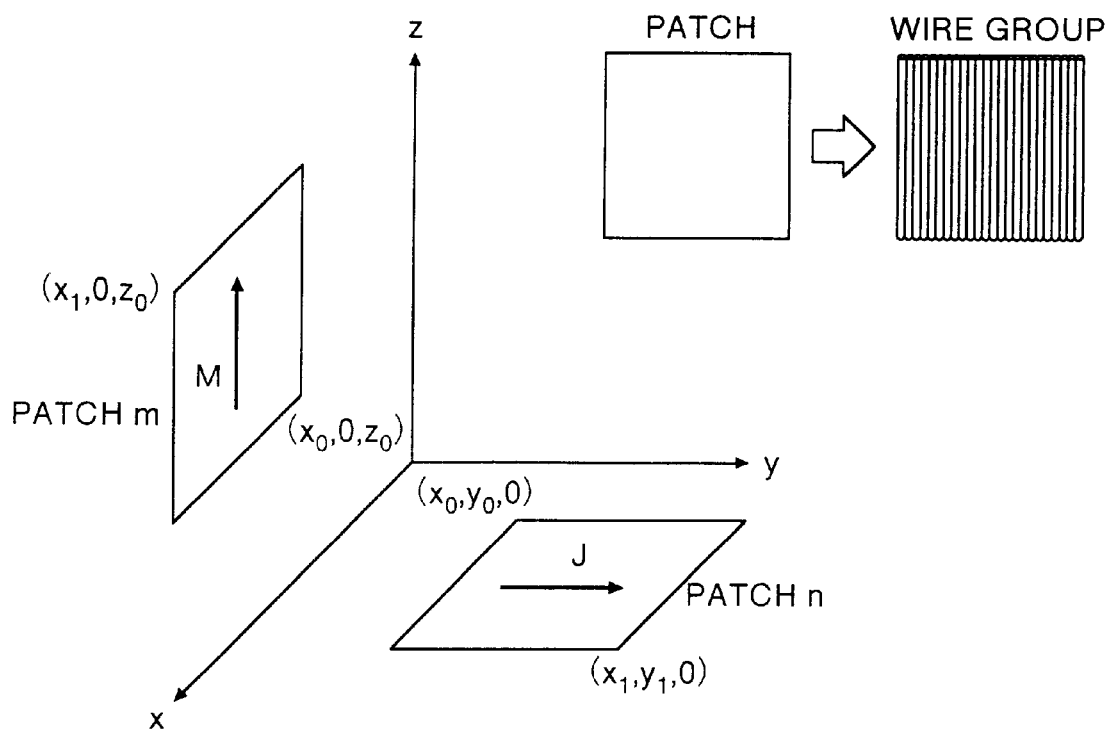
FIG. 10 shows mutual admittance between patches formed by an arrangement of monopoles.

In FIG. 10, it is assumed that the magnetic current M is on the patch m and the electric current J is on the patch n, and each patch comprises a group of monopoles aligned at infinitely small intervals. $\int\int\ \int\int$ represents a quadruple integration in which the result obtained by integration from x0 to x1 is integrated from X0 to X1, and then, the result obtained by further integrating the above-integrated result from y0 to y1 is further integrated from z0 to z1.

In this way, the mutual admittance between the patches can be calculated by obtaining the sum of the mutual admittances between the monopoles constituting the patch. However, to precisely compute the electromagnetic field of an electromagnetic wave radiated from a large-scale model, the above-described Gauss integration must be repeatedly performed many times, since the number of patches constituting the model is great. This requires an interminable processing time, and is not practical.

Accordingly, in the second embodiment described below, the mutual admittance between an electric current patch and a magnetic current patch is obtained not by the conventional numerical integration method but by using analytic solutions of the quadruple integration, enabling the intensity of the radiated electromagnetic field to be speedily computed.

Figure 11:
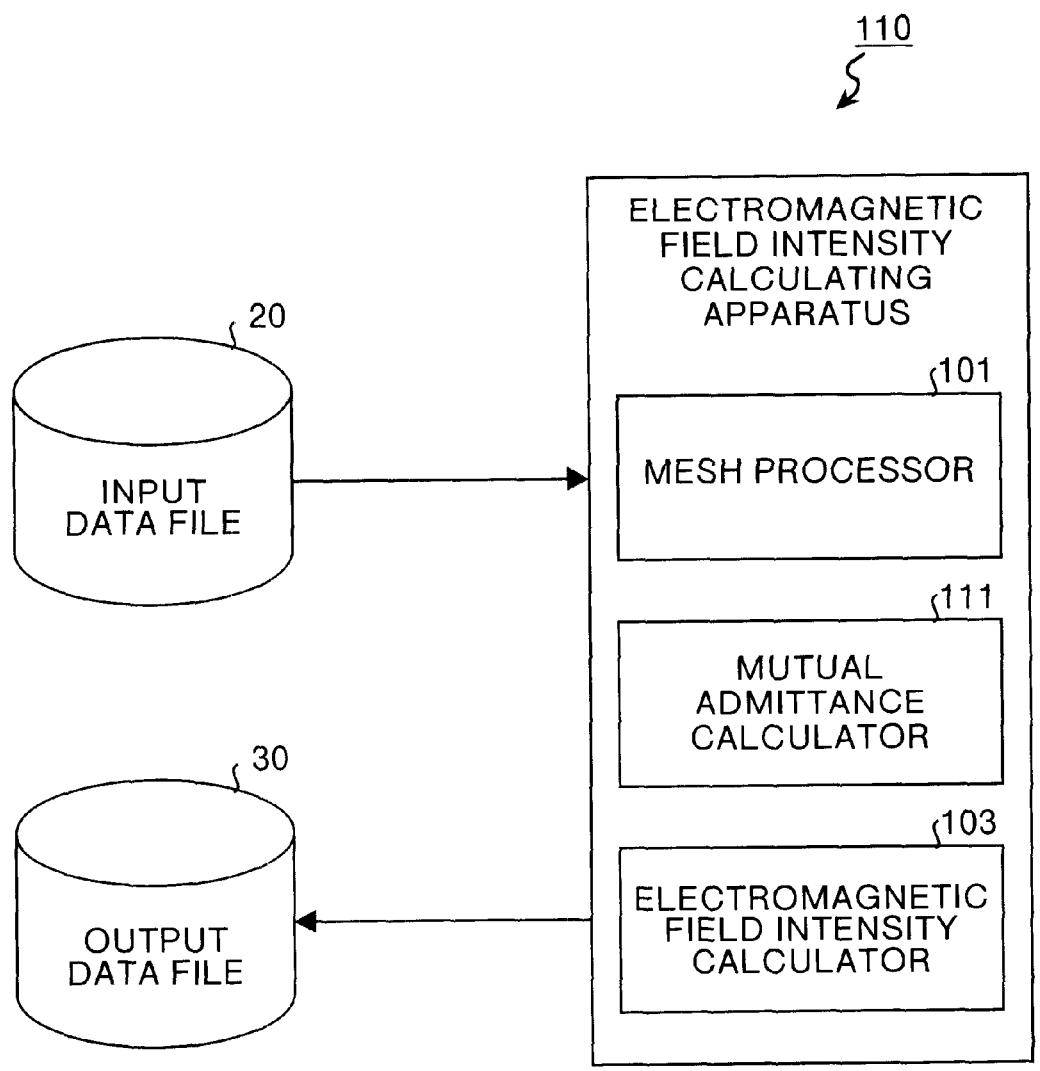
FIG. 11 is a block diagram showing the configuration of an electromagnetic field intensity calculating apparatus used in a second preferred embodiment.

FIG. 11 is a block diagram showing the constitution of an electromagnetic field intensity calculating apparatus used in the second preferred embodiment. The electromagnetic field intensity calculating apparatus 110 shown in FIG. 11 is an apparatus which simulates the electromagnetic field intensity of an electromagnetic wave radiated from electronic equipment to be analysed by using a moment method and calculates a mutual admittance between patches at a high speed by using not a numerical integration method (the Gauss integration method) requiring a long processing time but analytic solutions of a quadruple integration. Although not shown in FIG. 11, a mutual impedance between the patches can be calculated using analytic solutions of a quadruple integration in the same way as the first embodiment.

As shown in FIG. 11, the electromagnetic field intensity calculating apparatus 110 comprises a mesh processor 101, a mutual admittance calculator 111, an electromagnetic field intensity calculator 112, an input data file 20 and an output data file 30. Since the mesh processor 101, the input data file 20 and the output data file 30 are identical to those shown in FIG. 3, they are here represented by the same legends and detailed explanation thereof is omitted.

The mutual admittance calculator 111 is a processor which computes a mutual admittance between the patches by using the FRM method, and calculates the mutual admittance at a high speed by using analytic solutions of a quadruple integration.

The electromagnetic field intensity calculator 112 is a processor which calculates a radiated electromagnetic field based on mutual admittances and the like between dipole antennas calculated by the mutual admittance calculator 110.

The mesh processor 101, the mutual admittance calculator 111 and the electromagnetic field intensity calculator 112 may be installed as electromagnetic field intensity calculating programs in the electromagnetic field intensity calculating apparatus 110.

Subsequently, the calculation of the mutual impedance by the mutual admittance calculator 111 shown in FIG. 11 will be explained below. It is assumed that the distribution of an electric current flowing on a monopole is of a ramp type in which the electric current is linearly increased or decreased as shown in a graph of FIG. 12.

Figure 12:
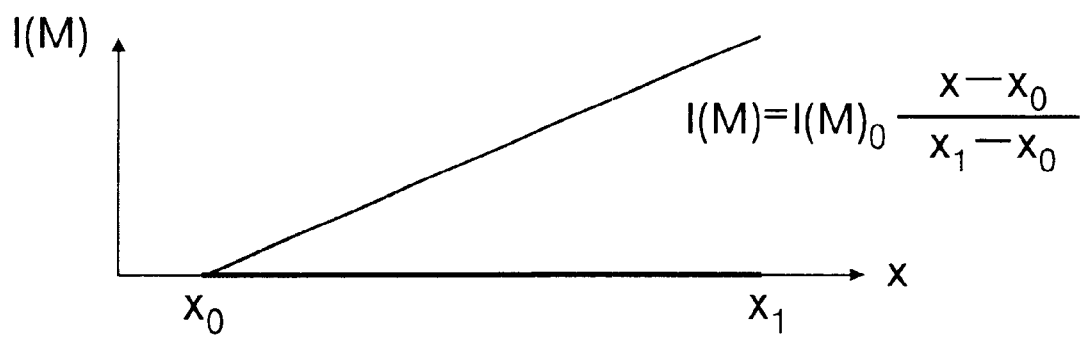
FIG. 12 is a graph showing the distribution of an electric current flowing on a monopole, which is assumed in the second embodiment.

With the electric current distribution of a ramp type as shown in FIG. 12, the mutual admittance $Y_{ij}$ expressed by the equation (15) is modified as follows:

$Y_{ij} = \{h\sin\phi/4\pi(x1-x0)(X1-X0)($ $y1-y0)(Z1-Z0)\}$ $\times \int\int \int\int (y-y0)(Z-Z0)\{-jk/r^2-1/r^3\}($ $e^{-jkr}/r)dxdXdydz$ \quad (16)

wherein $\int\int \int\int$ represents quadruple integration in which the result obtained by integration from x0 to x1 is integrated from X0 to X1, and then, the result obtained by further integrating the above-integrated result from y0 to y1 is further integrated from Y0 to Y1.

In a case when the size of the patches is sufficiently smaller than a distance r between the patches (e.g. when the size of the patch is one-tenth of the distance r between the patches), by expanding r around r0 by Macloughlin expansion, the equation (16) can be expressed as follows:

$Y_{ij} = \{h\sin\phi/4\pi(x1-x0)(X1-X0)(y1-y0)($ $Z1-Z0)\} \times e^{-jkr0}$ $\times \int\int \int\int (y-y0)(Z-Z0)\{-jk/r^2-1/r^3\}$ $\times \{1-jk(r-r0)-k^2(r-r0)^2/2$ $+jk^3(r-r0)^3/6\}dxdXdydz$ \quad (17)

wherein $\int\int \int\int$ represents quadruple integration in which the result obtained by integration from x0 to x1 is integrated from X0 to X1, and then, the result obtained by further integrating the above-integrated result from y0 to y1 is further integrated from Y0 to Y1; $\phi$ represents an angle between the patches, this being "1" in the positional relationship shown in FIG. 10.

In this way, when both the patches are rectangular in shape and are parallel or perpendicular to each other, the mutual admittance between the patches can be analytically obtained by changing the coordinate system.

Figure 13A:
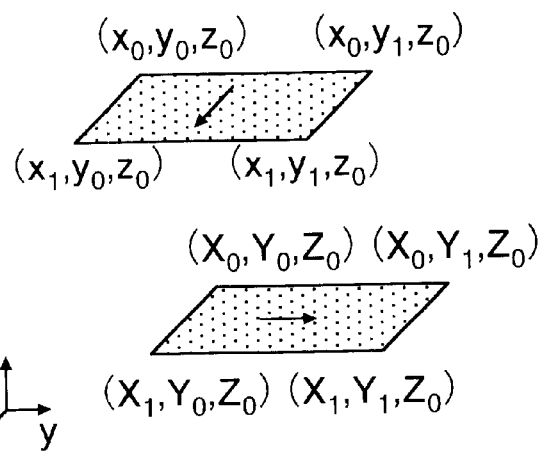
FIG. 13A to FIG. 13C show patterns representing the positional relationship between two rectangular dielectric patches.
Figure 13B:
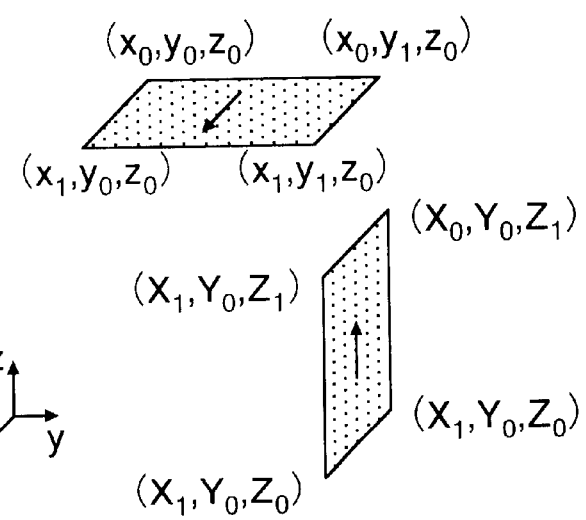
Figure 13C:
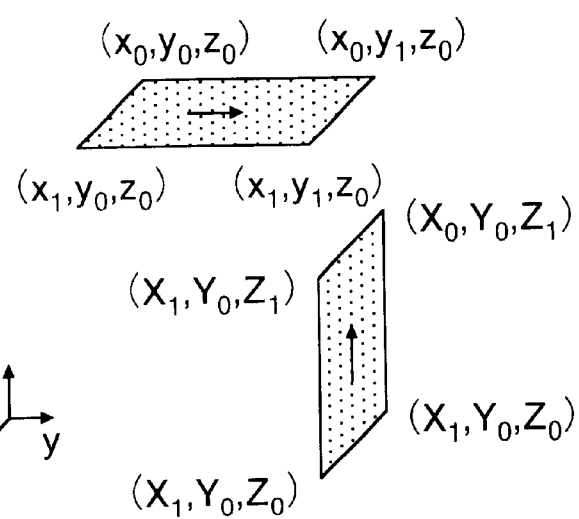

The positional relationship between the patches may be classified into the three cases shown in FIG. 13A to FIG. 13C based on the direction of the flow of the electromagnetic current. When items of the quadruple integration commonly appearing in the computation equations for the mutual admittances are extracted, the result is as shown below, and the mutual admittance is obtained by obtaining the analytic solutions of these quadruple integration.

FIG. 13A to FIG. 13C show patterns representing the positional relationship between two rectangular dielectric patches. FIG. 13A shows a case where the two dielectric patches are parallel to each other and the angle $\phi$ is 90°; FIG. 13B and 13C show cases where the two dielectric patches are perpendicular to each other and the angle $\phi$ is 90°.

When the patches are parallel to each other as shown in FIG. 13A, for a quadruple integration including $1/r^3$, there can be used four analytic solutions of the quadruple integration expressed as follows:

$\int\int \int\int xY/r^3 \, dxdXdydY$ $\int\int \int\int x/r^3 \, dxdXdydY$ $\int\int \int\int Y/r^3 \, dxdXdydY$ $\int\int \int\int 1/r^3 \, dxdXdydY$ When the patches are parallel to each other as shown in FIG. 13A, for a quadruple integration including $1/r$, there can be used four analytic solutions of the quadruple integration expressed as follows:

$\int\int \int\int xY/r \, dxdXdydY$ $\int\int \int\int x/r \, dxdXdydY$ $\int\int \int\int Y/r \, dxdXdydY$ $\int\int \int\int 1/r \, dxdXdydY$ wherein $\int\int \int\int$ represents quadruple integration in which the result obtained by integration from x0 to x1 is integrated from X0 to X1, and then, the result obtained by further integrating the above-integrated result from y0 to y1 is further integrated from Y0 to Y1. Further, it is assumed that $\xi=x-X$, $\eta=y-Y$, $h=z0-Z0$, $r=(\xi^2+\eta^2+h^2)^{1/2}$.

In contrast, when the patches are perpendicular to each other as shown in FIG. 13B and FIG. 13C, for a quadruple integration including $1/r^3$, there can be used ten analytic solutions of the quadruple integration expressed as follows:

$\int\int \int\int Z/r^3 \, dxdXdydZ$ $\int\int \int\int xy/r^3 \, dxdXdydz$ $\int\int \int\int xZ/r^3 \, dxdXdydZ$ $\int\int \int\int XyZ/r^3 \, dxdXdydZ$ $\int\int \int\int Xy/r^3 \, dxdXdydz$ $\int\int \int\int XZ/r^3 \, dxdXdydZ$ $\int\int \int\int yZ/r^3 \, dxdXdydZ$ $\int\int \int\int x/r^3 \, dxdXdydZ$ $\iint \iint X/r^3\, dxdXdydZ$ $\iint \iint y/r^3\, dxdXdydZ$ When the patches are perpendicular to each other as shown in FIG. 13B and FIG. 13C, for a quadruple integration including 1/r, there can be used ten analytic solutions of the quadruple integration expressed as follows:

$\iint \iint xyZ/r\, dxdXdydZ$ $\iint \iint xy/r\, dxdXdydZ$ $\iint \iint xZ/r\, dxdXdydZ$ $\iint \iint XyZ/r\, dxdXdydZ$ $\iint \iint Xy/r\, dxdXdydZ$ $\iint \iint XZ/r\, dxdXdydZ$ $\iint \iint yZ/r\, dxdXdydZ$ $\iint \iint x/r\, dxdXdydZ$ $\iint \iint X/r\, dxdXdydZ$ $\iint \iint y/r\, dxdXdydZ$ wherein $\iint \iint$ represents quadruple integration in which the result obtained by integration from x0 to x1 is integrated from X0 to X1, and then, the result obtained by further integrating the above-integrated result from y0 to y1 is further integrated from Y0 to Y1. Further, it is assumed that $\epsilon=x-X$, $\eta=y-Y$, $h=z0-z0$, $r=(\xi^2+\eta^2+h^2)^{1/2}$.

An example of the analytic solution of the above-mentioned quadruple integration will be explained below. The analytic solution expressed by $\iint \iint (1/r^3)\, dxdXdydY$ becomes as shown in FIG. 14, and basically, it can be expressed as the functions of r, $\xi$ and $\eta$. Therefore, the analytic solution of this quadruple integration can be obtained relatively easily. The same goes for the analytic solutions of the other quadruple integration.

The actual calculation there exist common factors in the analytic solutions of the integration. If these common factors are calculated before hand then the calculations can be performed more speedily. For example, the analytic solution expressed by $\iint \iint (1/r^3)\, dxdXdydY$ becomes as shown in FIG. 21, and consequently the sections A to D enclosed by the broken lines in FIG. 21 and FIG. 14 commonly appear in two types of analytic solutions. Therefore, previous computation of these common sections can further increase the speed of the calculation.

In this way, the mutual admittance calculator 111 shown in FIG. 11 computes the mutual admittance by using analytic solutions of the quadruple integration, but analytic solutions do not always exist for all the elements. For example, when the patches are perpendicular to each other, there are no analytic solutions for $\iint \iint x/r^3\, dxdXdydZ$ and $\iint \iint X/r^3\, dxdXdydZ$.

Therefore, in the present embodiment, solutions for these are obtained in partial combination with a numerical integration.

For example, $\iint \iint xr^{-3}\, dxdXdydZ$, and the integral variable is converted to obtain $x-X=\xi$, $x+X=\zeta$, $y-Y=y$, $Z-z=Z$ $\iint \iint xr^3\, dxdXdydZ$ $=1/2[\iint \iint 1/2\xi r^{-3}\, d\xi d\zeta dydz + \iint \iint \zeta r$ $-3d\,\xi d\,\zeta dydz]$ Although there is an analytic solution for $\iint \iint 1/2\,\xi r^{-3}\, d\xi d\zeta dydZ$, no analytic solution exists for $\iint \iint \zeta\, r^{-3}\, d\xi d\zeta dydZ$.

For this reason, the integral expressed by $\iint \iint \zeta r^{-3}\, d\xi d\zeta dydZ$ is expanded in the manner of the equation below, so that analytic solutions exists for sections other than those enclosed by the broken line.

$$\int \zeta/r^3\, d\xi d\zeta dydZ = \begin{array}{l} +2(X_1^2 - x_0^2)\int_{y,z}\int_{\xi 01}^{\xi 00} 1/r^3\, d\xi dydZ \\ +2(X_1^2 - X_0^2)\int_{y,z}\int_{\xi 00}^{\xi 11} 1/r^3\, d\xi dydZ \\ +2(x_1^2 - X_0^2)\int_{y,z}\int_{\xi 11}^{\xi 10} 1/r^3\, d\xi dydZ \end{array} \quad \begin{array}{l} +2(x_0 + X_1)\int_{y,z}\int_{\xi 01}^{\xi 00} \xi/r^3\, d\xi dydZ \\ +2(X_1 - X_0)\int_{y,z}\int_{\xi 01}^{\xi 00} \xi/r^3\, d\xi dydZ \\ -2(x_1 + X_0)\int_{y,z}\int_{\xi 11}^{\xi 10} \xi/r^3\, d\xi dydZ \end{array}$$

To obtain a solution for the section enclosed by the broken line, an undefined integral is defined as follows:

$\int 1/r^3\, d\,\zeta dy = F(\xi,y,Z)$ $F = 1/z\, \tan^{-1}(z/(r+\xi+y)) - 1/z\tan^{-1}(z/(r+\xi+y))$ and the section enclosed by the broken line becomes as shown in FIG. 15. Of the elements shown in FIG. 15, since there is no analytic solution for $\int 1/z\, \tan^{-1}(z/(r+\xi+y))dz$, this element is calculated by using a numerical integration such as, for example, the Gauss integration method.

In this way, in the present embodiment, when no analytic solution exist for a quadruple integration, solutions are obtained in partial combination with a numerical integration. Therefore, the solutions can be obtained more speedily than when using numerical integration for the entire quadruple integration.

Figure 16:
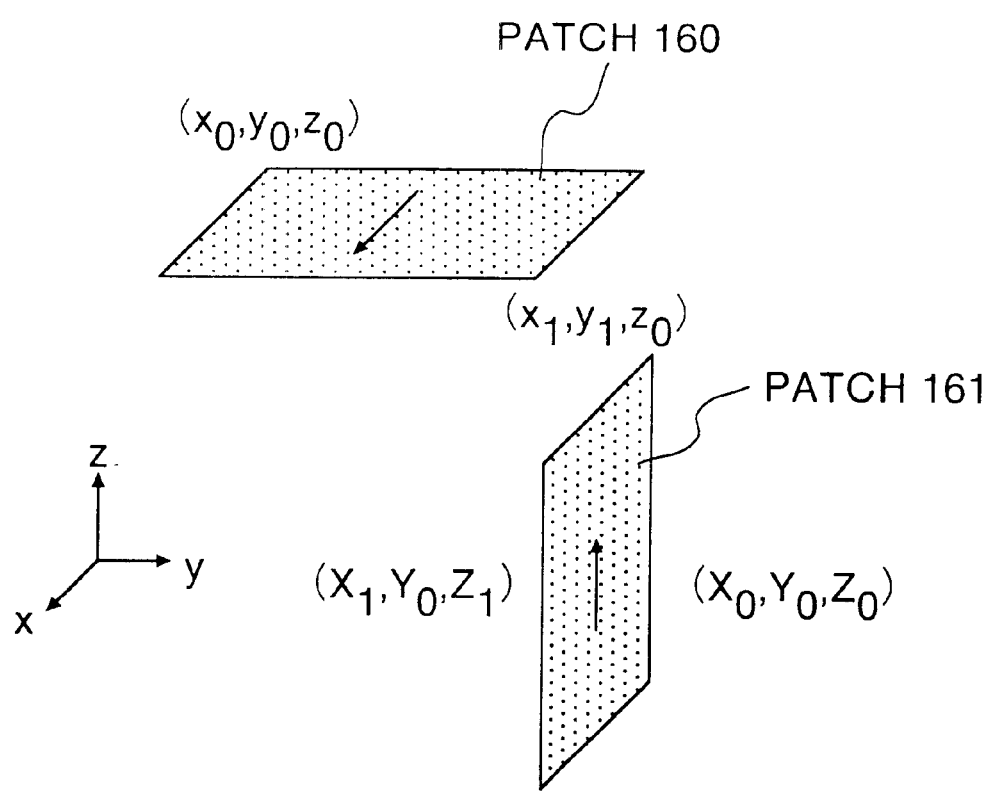
FIG. 16 shows coordinates conversion in a case where the patches are perpendicular to each other.

The mutual admittance calculator 111 shown in FIG. 11 converts the coordinates when the patches are perpendicular to each other, thereby increasing the computation speed. FIG. 16 shows coordinate conversion performed when the patches are perpendicular to each other.

In FIG. 16, a quadruple integration of $y/r^3$ is calculated and expressed as follows:

$$\int_{Z0}^{Z1}\int_{y0}^{y1}\int_{X0}^{X1}\int_{x0}^{x1} \frac{y}{r^3}\, dxdXdydZ =$$

$$\int_{Z0-z0}^{Z1-z0}\int_{y0-Y0}^{y1-Y0}\int_{X0}^{X1}\int_{x0}^{x1} \frac{t+Y_0}{r^3}\, dxdXdtdg$$

(wherein $t = y - Y_0$, $g = Z - z_0$)

wherein $r = ((x-X)^2 + (y-Y0)^2 + (z0-Z)^2)^{1/2}$.

The above calculation is very complex because no analytic solution exists for the quadruple integration expressed as $Y0/r^3$. Therefore, in the present embodiment, the coordinates are converted so that $Y0=z0=0$.

That is, by performing parallel shifting so that the patch 160 shown in FIG. 16 positioned on the x–y plane and the patch 161 position on the x–z plane, the integration can be simplified to the following equation:

$$\int_{Z0}^{Z1}\int_{y0}^{y1}\int_{X0}^{X1}\int_{x0}^{x1} \frac{y}{r^3} dx dX dy dZ = \int_{Z0}^{Z1}\int_{y0}^{y1}\int_{X0}^{X1}\int_{x0}^{x1} \frac{t}{r^3} dx dX dt dg$$

Conventionally, the number of divisions of the Gauss integration is determined based on the size of the patches and the distance therebetween. Specifically, the longer the distance between the patches in comparison to the size of the patches, the smaller the number of divisions are made. Therefore, in computing the mutual admittance between the patches, the number of divisions of the Gauss integration is small, and the calculated is completed in a short period of time. Thus, the overall calculation time can be minimized by calculating the mutual admittance by using the Gauss integration in the case where there is a small number of divisions, and using analytic solutions of the quadruple integration in the case where the number of divisions is great.

Figure 17:
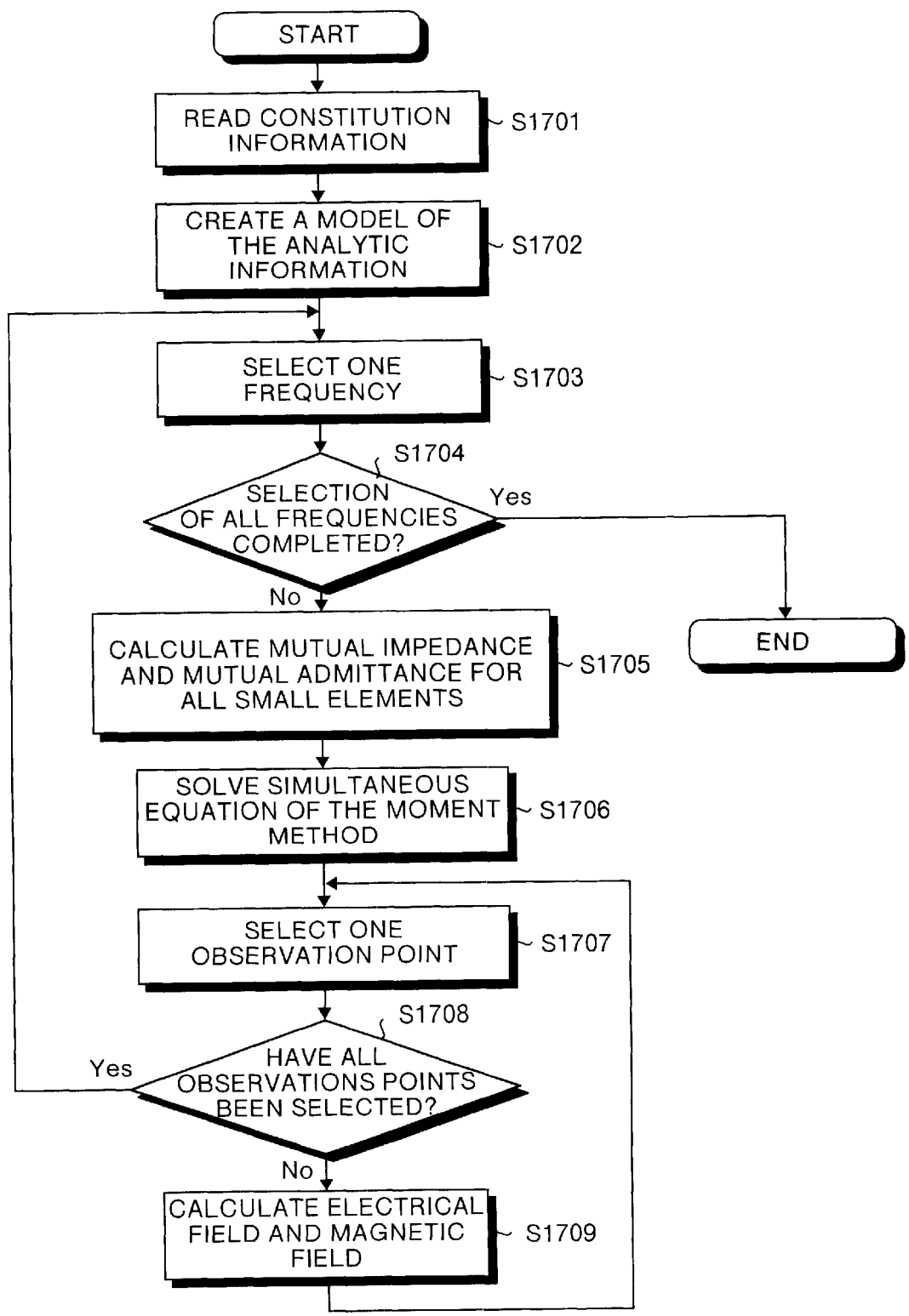
FIG. 17 is a flowchart showing a sequence of processes for calculating electromagnetic field intensity by the electromagnetic field intensity calculating apparatus shown in FIG. 11.

The process of computing the electromagnetic field intensity by the electromagnetic field intensity calculating apparatus 110 shown in FIG. 11 will be explained below. FIG. 17 is a flowchart showing a sequence of the processes for computing the electromagnetic field intensity performed by the electromagnetic field intensity calculating apparatus 110 shown in FIG. 11.

As shown in FIG. 17, the electromagnetic field intensity calculating apparatus 110 reads constitution information from the input data file 20 (Step S1701), and creates a model of the analytic information (Step S1702).

One frequency is selected (Step S1703), and it is determined whether all frequencies have been selected (Step S1704). When all frequencies have been selected (YES in the Step S1704), the processing is terminated.

On the other hand, when all the frequencies have not been selected (NO in the Step S1704), mutual impedance and mutual admittance is calculated for all the small elements (Step S1705), and simultaneous equations of the moment method is solved (Step S1706).

One observation point is selected (Step S1707), and it is determined whether all the observations points have been selected (Step S1708). When all the observations points have not been selected (NO in the Step S1708), the electrical field and the magnetic field are calculated and stored in the output data file 30 (Step S1709), and thereafter the processing is returned to Step S1907. On the other hand, when all the observations points have been selected (YES in the Step S1708), the processing is returned to the Step S1703 and the same processe is repeated.

Figure 18:
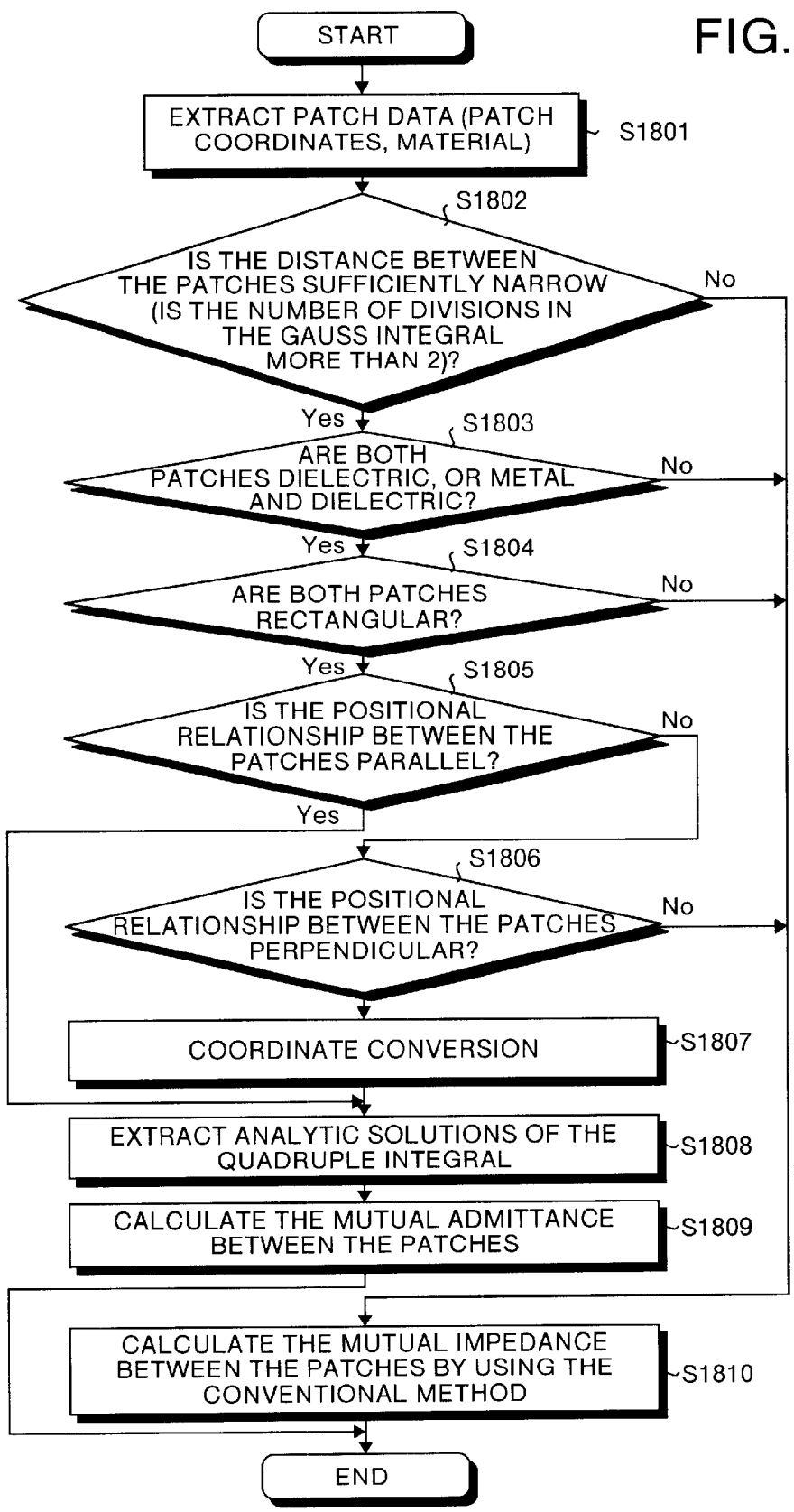
FIG. 18 is a flowchart showing a sequence for calculating mutual admittance shown information the Step S1705 of FIG. 17.

The process of calculation of the mutual admittance shown in the Step S1705 of FIG. 17 will be explained in detail here. FIG. 18 is a flowchart showing a sequence of processes for calculation of the mutual admittance shown in the Step S1705 of FIG. 17.

As shown in FIG. 18, the mutual admittance calculator 111 shown in FIG. 11 first extracts patch data (patch coordinates, material) (Step S1801), and determines whether the distance between the patches is sufficiently short (whether the number of divisions in the Gauss integration is more than 2) (Step S1802).

When it is determined that the distance between the patches is not narrow (NO in the Step S1802), the mutual 14. impedance between the patches is calculated using the conventional Gauss integration method or the like (Step S1810).

On the other hand, when the distance between the patches is sufficiently narrow (YES in the Step S1802), it is determined whether both the patches comprise dielectric or metal and dielectric (Step S1803). When these conditions are satisfied (YES in the Step S1803), it is determined whether both patches are rectangular in shape (Step S1804).

When both patches do not comprise metal (NO in the Step S1803), and when either of the patches is not rectangular (NO in the Step S1804), the mutual admittance between the patches is calculated using the conventional Gauss integration method or the like (Step S1810), since it is not possible to use an alytic solutions of the quadruple integration.

Thereafter, it is determined whether the the patches are parallel or perpendicular to each other (Steps S1805 to S1806). When the patches are perpendicular to each other, coordinate conversion is performed (Step S1807), analytic solutions of the quadruple integration are extracted (Step S1808), and the mutual admittance between the patches is calculated (Step S1809).

Different analytic solutions are used depending on whether the patches are parallel or perpendicular to each other. In addition, a numerical integration is also partially used for a quadruple integration having no analytic solutions.

As described above, in the second embodiment, the mutual admittance between the patches is calculated using the analytic solutions of the quadruple integration. Therefore, the electromagnetic field intensity can be computed at high speeded even in the case where dielectric patches are used.

Figure 19A:
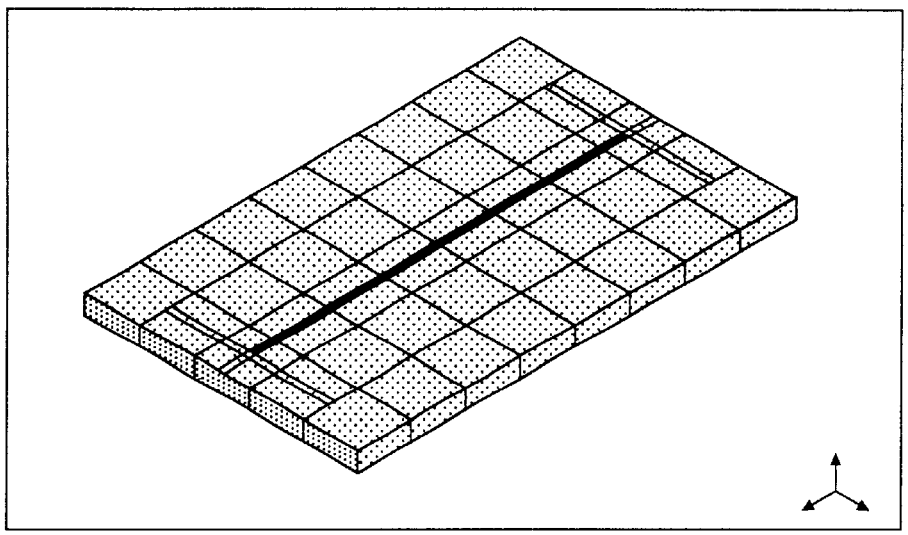
FIG. 19 shows a model used in verifying the calculation speed of analytic solutions of a quadruple integration.
Figure 19B:
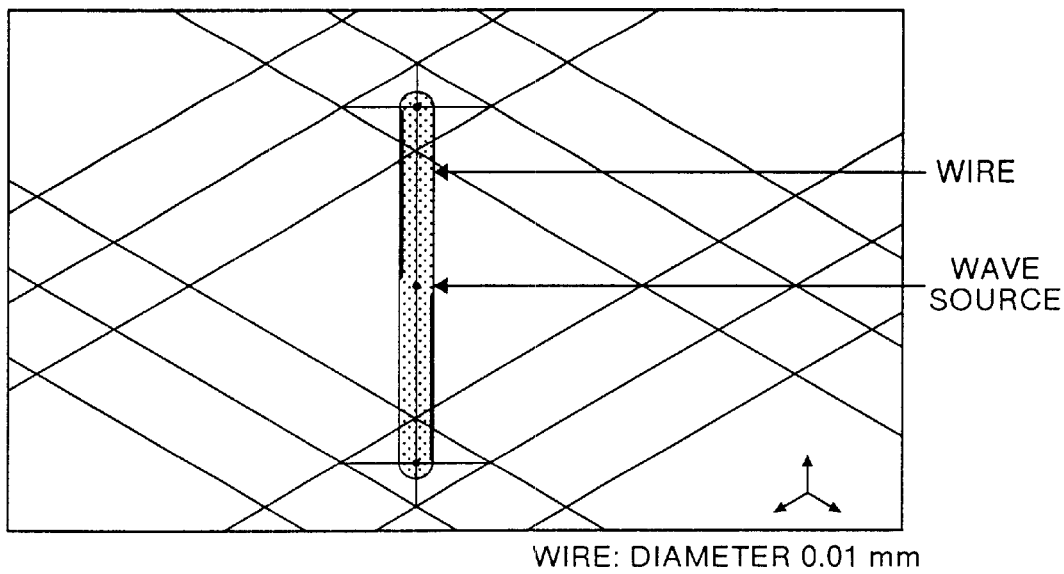

FIG. 19A and FIG. 19B show a model used in verifying the calculation speed of a quadruple integration. FIG. 19A shows a model used in the verification, and FIG. 19B shows a pattern end section in enlargement.

The model shown in FIG. 19A is a printed board having dimensions of 50 mm×80 mm×1 mm and a pattern having a width of 1 mm and a length of 70 mm. The bottom face of the model is a solid ground, a basic frequency is 20 MHz, a duty is 49%, and a wave source of classification #AS, the load being short or open. The analytic frequency is between 100 kHz and 700 kHz.

FIG. 20 shows a comparison between a case where a quadruple integration has been calculated by using analytic solutions, and a case where a quadruple integration has been calculated by using a Gauss integration (the conventional method). The result shows that the calculations can be performed on an average 1.9 times faster when the quadruple integration is calculated by using the analytic solutions than by using the Gauss integration. In FIG. 20, "immitance" is the time required to compute the mutual admittance between all the small elements, and "current" is the time required to compute the electric current flowing in all the small elements.

As described above, according to one aspect of this invention, it is possible to produce an advantage of providing the electromagnetic field intensity calculating apparatus capable of efficiently computing the mutual impedance between the patches at a high speed since the electromagnetic field intensity calculating apparatus is configured such that the mutual impedance between the patches is computed based on the previously computed analytic solutions of the quadruple integration under the condition that the patches are rectangular in shape and are parallel or perpendicular to each other and the electromagnetic field intensity is calculated based on the computed mutual impedance.

Furthermore, according to other aspect of this invention, it is possible to produce an advantage of providing the electromagnetic field intensity calculating apparatus capable of efficiently computing the mutual admittance between the patches at a high speed since the electromagnetic field intensity calculating apparatus is configured such that the mutual admittance between the patches is computed based on the previously computed analytic solutions of the quadruple integration under the condition that the patches are rectangular in shape and are parallel or perpendicular to each other and the electromagnetic field intensity is calculated based on the computed mutual admittance.

Furthermore, according to other aspect of this invention, it is possible to produce an advantage of providing the electromagnetic field intensity calculating method capable of efficiently computing the mutual impedance between the patches at a high speed since the electromagnetic field intensity calculating method is constituted such that the mutual impedance between the patches is computed based on the previously computed analytic solutions of the quadruple integration under the condition that the patches are rectangular in shape and are parallel or perpendicular to each other and the electromagnetic field intensity is calculated based on the computed mutual impedance.

Furthermore, according to other aspect of this invention, it is possible to produce an advantage of providing an electromagnetic field intensity calculating method capable of efficiently computing the mutual admittance between the patches at a high speed since the electromagnetic field intensity calculating method is constituted such that the mutual admittance between the patches is computed based on the previously computed analytic solutions of the quadruple integration under the condition that the patches are rectangular in shape and are parallel or perpendicular to each other and the electromagnetic field intensity is calculated based on the computed mutual admittance.

Furthermore, according to other aspect of this invention, it is possible to produce an advantage of providing a recording medium which is capable of allowing a computer to compute the mutual impedance between the patches based on previously computed analytic solutions of a quadruple integration under the condition that the patches are rectangular in shape and are parallel or perpendicular to each other, and calculate the electromagnetic field intensity based on the computed mutual impedance.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. An apparatus for calculating the electromagnetic field intensity by dividing a target device into a plurality of patches based on a moment method and using a mutual impedance between the patches, said apparatus comprising:
   a mutual impedance computing unit which computes a mutual impedance between the patches based on previously computed analytic solutions of a quadruple integration under a condition that the patches are rectangular in shape and are parallel or perpendicular to each other; and
   an electromagnetic field intensity calculating unit which calculates the electromagnetic field intensity based on the mutual impedance computed by said mutual impedance computing unit.

2. An apparatus for calculating the electromagnetic field intensity according to claim 1, wherein the mutual impedance computing unit classifies the positional relationship between the patches into a plurality of patterns in consideration of the direction of an electric current flowing in each of the patches, and then, computes the mutual impedance between the patches based on the analytic solutions of the quadruple integration commonly appearing in computation equations of the mutual impedances of the patterns.

3. An apparatus for calculating the electromagnetic field intensity according to claim 1, wherein when the patches are parallel to each other, the mutual impedance computing unit computes the mutual impedance between the patches by using five analytic solutions of the quadruple integration as follows:

$$\iint \iint (1/r)\, dxdXdydY$$

$$\iint \iint (x/r)\, dxdXdydY$$

$$\iint \iint (X/r)\, dxdXdydY$$

$$\iint \iint (xX/r)\, dxdXdydY$$

$$\iint \iint r\, dxdXdydY.$$

4. An apparatus for calculating the electromagnetic field intensity according to claim 1, wherein when the patches are perpendicular to each other, the mutual impedance computing unit computes the mutual impedance between the patches by using five analytic solutions of the quadruple integration as follows:

$$\iint \iint (1/r)\, dxdXdydZ$$

$$\iint \iint (x/r)\, dxdXdydZ$$

$$\iint \iint (X/r)\, dxdXdydZ$$

$$\iint \iint (xX/r)\, dxdXdydZ$$

$$\iint \iint r\, dxdXdydZ.$$

5. An apparatus for calculating the electromagnetic field intensity according to claim 1, wherein the mutual impedance computing unit computes the mutual impedance between the patches by using the analytic solutions under the condition that the patches are rectangular in shape and are parallel or perpendicular to each other, and computes the mutual impedance nonanalytically if the target device includes patches that are not rectangular and neither parallel nor perpendicular to each other.

6. An apparatus for calculating the electromagnetic field intensity according to claim 1, wherein the mutual impedance computing unit comprises a common item computing unit which computes common item appearing commonly in the analytic solutions, and an analytic solution computing unit which computes the analytic solutions by using the common items computed by the common item computing unit.

7. An apparatus for calculating the electromagnetic field intensity by dividing a target device into a plurality of dielectric patches based on a moment method and using a mutual admittance between the patches, said apparatus comprising:
   a mutual admittance computing unit which computes a mutual admittance between the patches based on previously computed analytic solutions of a quadruple integration under a condition that the patches are rectangular in shape and are parallel or perpendicular to each other; and
   an electromagnetic field intensity calculating unit which calculates the electromagnetic field intensity based on the mutual admittance computed by said mutual admittance computing unit.

8. An apparatus for calculating the electromagnetic field intensity according to claim 7, wherein when the patches are parallel to each other, the mutual admittance computing unit computes the mutual admittance between the patches by using eight analytic solutions of the quadruple integration as follows:

$$\iint \iint xY/r^3 \, dxdXdydY$$

$$\iint \iint x/r^3 \, dxdXdydY$$

$$\iint \iint Y/r^3 \, dxdXdydY$$

$$\iint \iint 1/r^3 \, dxdXdydY$$

$$\iint \iint xY/r \, dxdXdydY$$

$$\iint \iint x/r \, dxdXdydY$$

$$\iint \iint Y/r \, dxdXdydY$$

$$\iint \iint 1/r \, dxdXdydY.$$

9. An apparatus for calculating the electromagnetic field intensity according to claim 7, wherein when the patches are perpendicular to each other, the mutual admittance computing unit computes the mutual admittance between the patches by using ten analytic solutions of the quadruple integration as follows:

$$\iint \iint xyZ/r^3 \, dxdXdydZ$$

$$\iint \iint xy/r^3 \, dxdXdydZ$$

$$\iint \iint xZ/r^3 \, dxdXdydZ$$

$$\iint \iint XyZ/r^3 \, dxdXdydZ$$

$$\iint \iint Xy/r^3 \, dxdXdydZ$$

$$\iint \iint yZ/r^3 \, dxdXdydZ$$

$$\iint \iint yZ/r^3 \, dxdXdydZ$$

$$\iint \iint x/r^3 \, dxdXdydZ$$

$$\iint \iint X/r^3 \, dxdXdydZ$$

$$\iint \iint y/r^3 \, dxdXdydZ.$$

10. An apparatus for calculating the electromagnetic field intensity according to claim 7, wherein the mutual admittance computing unit computes the mutual admittance between the patches by using the analytic solutions under the condition that the patches are rectangular in shape and are parallel or perpendicular to each other, and computes the mutual admittance nonanalytically if the target device includes patches that are not rectangular and neither parallel nor perpendicular to each other.

11. An apparatus for calculating the electromagnetic field intensity according to claim 7, wherein the mutual admittance computing unit comprises a common item computing unit which computes common item appearing commonly in the analytic solutions, and an analytic solution computing unit which computes the analytic solutions by using the common items computed by the common item computing unit.

12. An apparatus for calculating the electromagnetic field intensity according to claim 7, wherein the mutual admittance computing unit calculates a quadruple integration for which no analytic solutions exist partially by using a numerical integration and calculates other parts analytically.

13. An apparatus for calculating the electromagnetic field intensity according to claim 7, wherein when the two patches are perpendicular to each other, the mutual admittance computing unit computes the mutual admittance after changing coordinates on the coordinate axis planes of the patches.

14. A method of calculating the electromagnetic field intensity by dividing a target device into a plurality of patches based on a moment method and using a mutual impedance between the patches, said method comprising:

computing a mutual impedance between the patches based on previously computed analytic solutions of a quadruple integration under a condition that the patches are rectangular in shape and are parallel or perpendicular to each other; and calculating the electromagnetic field intensity based on the mutual impedance computed in the mutual impedance computing.

15. A method of calculating the electromagnetic field intensity according to claim 14, wherein in the mutual impedance computing, the positional relationship between the patches is classified into a plurality of patterns in consideration of the direction of an electric current flowing in each of the patches, and the mutual impedance between the patches is computed based on the analytic solutions of the quadruple integration commonly appearing in computation equations of the mutual impedances of the patterns.

16. A method of calculating the electromagnetic field intensity according to claim 14, wherein when the patches are parallel to each other, the mutual impedance between the patches is computed by using five analytic solutions of the quadruple integration as follows:

$$\iint \iint (1/r) \, dxdXdydY$$

$$\iint \iint (x/r) \, dxdXdydY$$

$$\iint \iint (X/r) \, dxdXdydY$$

$$\iint \iint (xX/r) \, dxdXdydY$$

$$\iint \iint dxdXdydY.$$

17. A method of calculating the electromagnetic field intensity according to claim 14, wherein when the patches are perpendicular to each other, the mutual impedance between the patches is computed by using five analytic solutions of the quadruple integration as follows:

$$\iint \iint (1/r) \, dxdXdydZ$$

$$\iint \iint (x/r) \, dxdXdydZ$$

$$\iint \iint (X/r) \, dxdXdydZ$$

$$\iint \iint (xX/r) \, dxdXdydZ$$

$$\iint \iint r \, dxdxdydz.$$

18. A method of calculating the electromagnetic field intensity according to claim 14, wherein the mutual impedance between the patches is computed by using the analytic solutions under the condition that the patches are rectangular in shape and are parallel or perpendicular to each other, and the mutual impedance is computed nonanalytically if the target device includes patches that are not rectangular and neither parallel nor perpendicular to each other.

19. A method of calculating the electromagnetic field intensity according to claim 14, in the mutual impedance computing, comprising computing common items appearing commonly in the analytic solutions, and computing the analytic solutions by using the common items computed in the common item computing.

20. A method of calculating the electromagnetic field intensity by dividing a target device into a plurality of dielectric patches based on a moment method and using a mutual admittance between the patches, said method comprising:

computing a mutual admittance between the patches based on previously computed analytic solutions of a quadruple integration under a condition that the patches are rectangular in shape and are parallel or perpendicular to each other; and calculating the electromagnetic field intensity based on the mutual admittance computed in the mutual admittance computing.

21. A method of calculating the electromagnetic field intensity according to claim 20, wherein when the patches are parallel to each other, the mutual admittance between the patches is computed by using eight analytic solutions of the quadruple integration as follows:

$$\int\int\int\int xY/r^3\ dxdXdydY$$

$$\int\int\int\int x/r^3\ dxdXdydY$$

$$\int\int\int\int Y/r^3\ dxdXdydY$$

$$\int\int\int\int 1/r^3\ dxdXdydY$$

$$\int\int\int\int xY/r\ dxdXdydY$$

$$\int\int\int\int x/r\ dxdXdydY$$

$$\int\int\int\int Y/r\ dxdXdydY$$

$$\int\int\int\int 1/r\ dxdXdydY.$$

22. A method of calculating the electromagnetic field intensity according to claim 20, wherein when the patches are perpendicular to each other, the mutual admittance between the patches is computed by using ten analytic solutions of the quadruple integration as follows:

$$\int\int\int\int xyZ/r^3\ dxdXdydZ$$

$$\int\int\int\int xy/r^3\ dxdXdydZ$$

$$\int\int\int\int xZ/r^3\ dxdXdydz$$

$$\int\int\int\int XyZ/r^3\ dxdxdydz$$

$$\int\int\int\int Xy/r^3\ dxdxdydz$$

$$\int\int\int\int XZ/r^3\ dxdxdydz$$

$$\int\int\int\int yZ/r^3\ dxdXdydZ$$

$$\int\int\int\int x/r^3\ dxdxdydz$$

$$\int\int\int\int X/r^3\ dxdXdydZ$$

$$\int\int\int\int y/r^3\ dxdXdydZ.$$

23. A method of calculating the electromagnetic field intensity according to claim 20, wherein the mutual admittance between the patches is computed by using the analytic solutions under the condition that the patches are rectangular in shape and are parallel or perpendicular to each other, and the mutual admittance is computed nonanalytically if the target device includes patches that are not rectangular and neither parallel nor perpendicular to each other.

24. A method of calculating the electromagnetic field intensity according to claim 20, in the mutual admittance computing, comprising computing common items appearing commonly in the analytic solutions, and computing the analytic solutions by using the common items computed in the common item computing.

25. A method of calculating the electromagnetic field intensity according to claim 20, wherein in the mutual admittance computing, a quadruple integration for which no analytic solutions exist is calculated partially by using a numerical integration and other parts are calculated analytically.

26. A method of calculating the electromagnetic field intensity according to claim 20, wherein when the two patches are perpendicular to each other, in the mutual admittance computing the mutual admittance is computed after changing coordinates on the coordinate axis planes of the patches.

27. A computer-readable recording medium for storing instructions, which when executed by a computer, causes the computer to realize a method of calculating the electromagnetic field intensity by dividing a target device into a plurality of patches based on a moment method and using a mutual impedance between patches, the method comprising:

computing the mutual impedance between the patches based on previously computed analytic solutions of a quadruple integration under a condition that the patches are rectangular in shape and are parallel or perpendicular to each other; and calculating the electromagnetic field intensity based on the mutual impedance computed in the mutual impedance computing.

28. A computer-readable recording medium in which are recorded programs for allowing a computer to execute an electromagnetic field intensity calculating method for calculating electromagnetic field intensity by dividing a target device into a plurality of patches based on a moment method and using a mutual admittance between patches, the method comprising:

computing the mutual admittance between the patches based on previously computed analytic solutions of a quadruple integration under a condition that the patches are rectangular in shape and are parallel or perpendicular to each other; and calculating the electromagnetic field intensity based on the mutual admittance computed in the mutual admittance computing.

* * * * *